(12) United States Patent
Ono

(10) Patent No.: US 11,877,076 B2
(45) Date of Patent: Jan. 16, 2024

(54) IMAGING DEVICE AND IMAGING METHOD

(71) Applicant: FUJIFILM Corporation, Tokyo (JP)

(72) Inventor: Shuji Ono, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 304 days.

(21) Appl. No.: 17/322,923

(22) Filed: May 18, 2021

(65) Prior Publication Data

US 2021/0274065 A1  Sep. 2, 2021

Related U.S. Application Data

(63) Continuation of application No. PCT/JP2019/042861, filed on Oct. 31, 2019.

(30) Foreign Application Priority Data

Nov. 26, 2018 (JP) ................. 2018-220491

(51) Int. Cl.
*H04N 25/62* (2023.01)
*G02B 5/20* (2006.01)
*G02B 5/30* (2006.01)

(52) U.S. Cl.
CPC ............. *H04N 25/62* (2023.01); *G02B 5/201* (2013.01); *G02B 5/3025* (2013.01)

(58) Field of Classification Search
CPC ........ H04N 25/62; H04N 25/70; H04N 23/12; H04N 23/55; G02B 5/201; G02B 5/3025;

(Continued)

(56) References Cited

U.S. PATENT DOCUMENTS 9,661,193 B2 * 5/2017 Narumi ................. H04N 5/211
2009/0179143 A1 7/2009 Murooka et al.
(Continued)

FOREIGN PATENT DOCUMENTS

JP 2009162847 7/2009
JP 2009169096 7/2009
(Continued)

OTHER PUBLICATIONS

"International Search Report (Form PCT/ISA/210) of PCT/JP2019/042861," dated Jan. 28, 2020, with English translation thereof, pp. 1-5.

(Continued)

*Primary Examiner* — Kelly L Jerabek
(74) *Attorney, Agent, or Firm* — JCIPRNET

(57) ABSTRACT

Provided are an imaging device and an imaging method that can suppress a difference in appearance caused by a difference between the polarization directions of received light in a case in which different images are generated on the basis of light having different polarization directions, have flexibility in the design of the polarization direction of light forming different images, and can generate a plurality of images having a uniform amount of light. An imaging device (1) includes: an imaging optical system (10); a first polarizer that aligns a polarization direction of light transmitted through a first pupil region (E1) and a second pupil region (E2); a wave plate (14) that converts the light into circularly or elliptically polarized light; a second polarizer that transmits light in a second polarization direction different from the first polarization direction; a third polarizer that transmits light in a third polarization direction different from the first polarization direction and the second polarization direction; an imaging element (100) that has a plurality of pixel units receiving the light transmitted through the first pupil (Continued)

region and the second pupil region; and an image generation unit.

20 Claims, 15 Drawing Sheets

(58) Field of Classification Search
CPC ... G02B 27/286; G02B 3/0056; G01J 3/0224; G01J 3/2803; H01L 27/14625; H01L 27/14627
See application file for complete search history.

(56) References Cited

U.S. PATENT DOCUMENTS

| | | | | |
|---|---|---|---|---|
| 2012/0249752 | A1* | 10/2012 | Baba | H04N 13/218 348/E13.074 |
| 2013/0083172 | A1 | 4/2013 | Baba | |
| 2015/0192758 | A1* | 7/2015 | Yamagata | H04N 25/62 348/360 |
| 2015/0381871 | A1* | 12/2015 | Makino | H04N 23/951 348/335 |
| 2016/0065938 | A1* | 3/2016 | Kazemzadeh | H04N 23/11 348/46 |
| 2019/0260974 | A1 | 8/2019 | Kaizu et al. | |
| 2021/0306584 | A1* | 9/2021 | Moriyama | G02B 5/3058 |

FOREIGN PATENT DOCUMENTS

| | | |
|---|---|---|
| JP | 2013077935 | 4/2013 |
| JP | 2013197770 | 9/2013 |
| WO | 2018074064 | 4/2018 |

OTHER PUBLICATIONS

"Written Opinion of the International Searching Authority (Form PCT/ISA/237) of PCT/JP2019/042861," dated Jan. 28, 2020, with English translation thereof, pp. 1-11.

* cited by examiner

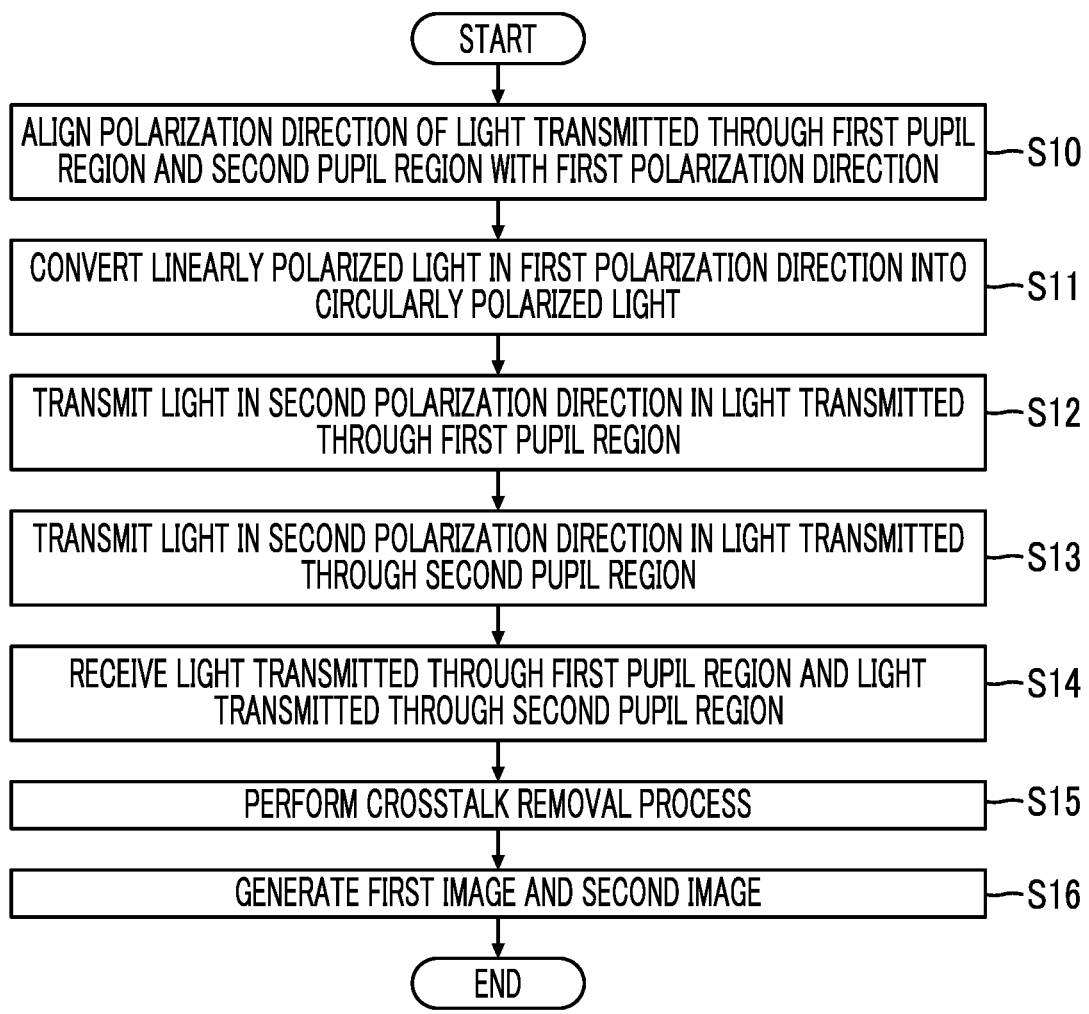

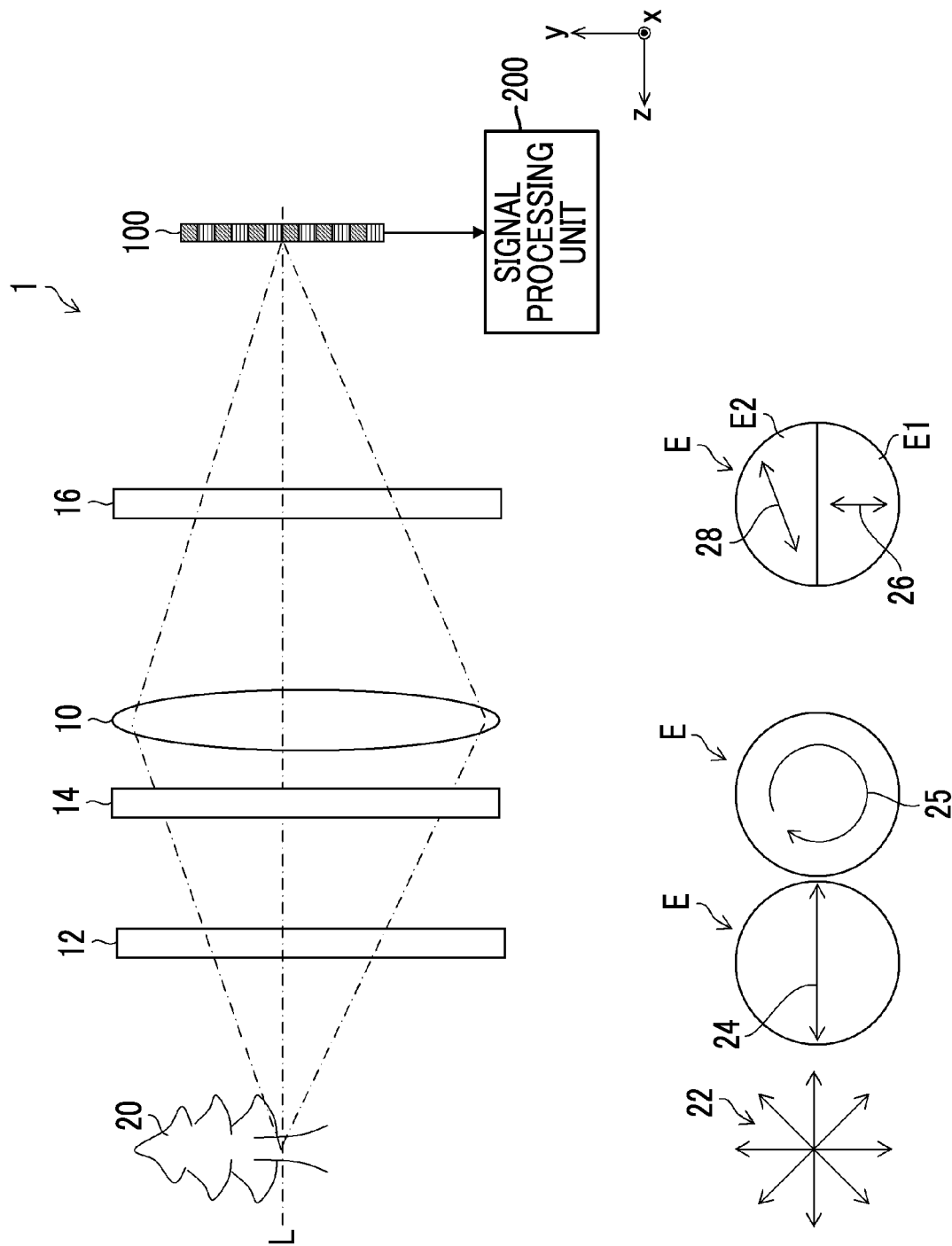

IMAGING DEVICE AND IMAGING METHOD

CROSS-REFERENCE TO RELATED APPLICATIONS

The present application is a Continuation of PCT International Application No. PCT/JP2019/042861 filed on Oct. 31, 2019 claiming priority under 35 U.S.C § 119(a) to Japanese Patent Application No. 2018-220491 filed on Nov. 26, 2018. Each of the above applications is hereby expressly incorporated by reference, in its entirety, into the present application.

BACKGROUND OF THE INVENTION

1. Field of the Invention

The present invention relates to an imaging device and an imaging method, and more particularly, to an imaging device and an imaging method that independently acquire a plurality of images with one imaging element.

2. Description of the Related Art

In the related art, a technique has been proposed in which light in two different polarization directions is acquired by different pixels to acquire two independent images.

For example, JP2009-169096A discloses a technique in which light in two different polarization directions is received by different pixels to acquire two independent images. A light receiving element described in JP2009-169096A comprises an analyzer array that transmits light transmitted through a polarizer of a polarizing plate, and each image corresponding to light in different polarization directions received by the light receiving element is generated.

SUMMARY OF THE INVENTION

Here, in the technique described in JP2009-169096A, the images corresponding to the light in different polarization directions are generated. However, two types of light in different polarization directions are generated without aligning the polarization directions even once. Specifically, in JP2009-169096A, first, light transmitted through a lens is transmitted through a polarizing plate that transmits light having two types of polarization directions to generate two types of light having different polarization directions. Then, the two types of light having different polarization directions are transmitted through an analyzer and are received by the light receiving element. Therefore, in the imaging device described in JP2009-169096A, two types of light having different polarization directions are generated without aligning the polarization directions even once, and each image is generated on the basis of the light.

As such, in a case in which images are generated on the basis of light having different polarization directions without aligning the polarization directions even once, the following problems may occur.

For example, a technique is known which captures an image of a water surface at the Brewster's angle using a polarization filter to shield s-polarized light. However, in a case in which light having different polarization directions is generated from the beginning, one polarization direction can be aligned with a direction in which the s-polarized light is shielded, but it is difficult to align the other polarization direction with the direction in which the s-polarized light is shielded.

In addition, a technique is known which estimates the sugar content of fruits using spectral reflectance. However, in a case in which images based on light having different polarization directions are used without aligning the polarization directions even once, the spectral reflectance may not be calculated properly. Specifically, in the images based on the light having different polarization directions which have been obtained without aligning the polarization directions even once, for a high glossy portion of the object, the number of specular reflected light components is large, and the correct spectral reflectance is not obtained.

Further, for example, in the generation of a parallax image, in a case in which the polarization directions are not aligned even once, the erroneous detection of the amount of parallax is likely to occur due to the difference in appearance between images. Specifically, in a case in which a parallax image is generated for a glossy object on the basis of light having different polarization directions, gloss is suppressed in a region matched with the Brewster's angle in one image, and the gloss is not suppressed in the other image. As a result, a large difference in appearance between both images may occur, and the erroneous detection of the amount of parallax may occur.

On the other hand, a technique is considered which linearly polarizes incident light to align a polarization direction once (in the following description, the aligned polarization direction is referred to as a first polarization direction), generates light having a plurality of different polarization directions, and obtain images. In this case, the polarization direction in a case in which light having a plurality of different polarization directions is generated may be limited. Specifically, since the polarization direction orthogonal to the polarization direction which has been aligned once is shielded, it is difficult to generate an image with light having a polarization direction orthogonal to the first polarization direction. In addition, since the amount of light transmitted is reduced at an angle close to the angle orthogonal to the first polarization direction, it is not preferable to generate an image with light having a polarization direction close to the orthogonal angle. Further, since the amount of light forming a plurality of images increases or decreases in relation to the first polarization direction, it is difficult to maintain the uniformity of the amount of light in the plurality of obtained images.

The invention has been made in view of the above-mentioned problems, and an object of the invention is to provide an imaging device and an imaging method that can suppress a difference in appearance caused by a difference between the polarization directions of received light in a case in which different images are generated on the basis of light having different polarization directions, have flexibility in the design of the polarization direction of light forming the obtained images, and can generate a plurality of images having a uniform amount of light.

According to an aspect of the invention, there is provided an imaging device comprising: an imaging optical system that has a pupil region including a first pupil region and a second pupil region different from the first pupil region; a first polarizer that aligns a polarization direction of light transmitted through the first pupil region and the second pupil region with a first polarization direction; a wave plate that converts linearly polarized light aligned in the first polarization direction by the first polarizer into circularly or elliptically polarized light; a second polarizer that transmits light in a second polarization direction different from the first polarization direction in the light which has been transmitted through the first pupil region and has been converted into the circularly or elliptically polarized light; a third polarizer that transmits light in a third polarization direction different from the first polarization direction and the second polarization direction in the light which has been transmitted through the second pupil region and has been converted into the circularly or elliptically polarized light; an imaging element that receives the light transmitted through the first pupil region and the second pupil region and has a plurality of pixel units each of which is a set of a first pixel and a second pixel receiving light in different polarization directions; and an image generation unit that performs a crosstalk removal process on pixel signals of the first pixel and the second pixel and generates a first image corresponding to the light transmitted through the first pupil region and a second image corresponding to the light transmitted through the second pupil region on the basis of the pixel signals subjected to the crosstalk removal process.

According to this aspect, the first polarizer aligns the polarization direction of the light transmitted through the first pupil region and the second pupil region with the first polarization direction. Therefore, even in a case in which different images are generated on the basis of light having different polarization directions, it is possible to generate the images between which a difference in appearance caused by a difference between the polarization directions of the received light is suppressed. In addition, according to this aspect, the wave plate converts the linearly polarized light aligned in the first polarization direction into the circularly or elliptically polarized light. Therefore, it is possible to design the polarization direction of each light component forming the obtained images as any direction. The amounts of light of the obtained images do not depend on the polarization direction, and it is possible to obtain images having a uniform amount of light.

According to another aspect of the invention, there is provided an imaging device comprising: an imaging optical system that has a pupil region including a first pupil region and a second pupil region different from the first pupil region; a first polarizer that aligns a polarization direction of light transmitted through the first pupil region and the second pupil region with a first polarization direction; a wave plate that converts linearly polarized light aligned in the first polarization direction by the first polarizer into circularly or elliptically polarized light; a second polarizer that transmits light in a second polarization direction different from the first polarization direction in the light which has been transmitted through the first pupil region and has been converted into the circularly or elliptically polarized light; a third polarizer that transmits light in a third polarization direction, which is different from the first polarization direction and is orthogonal to the second polarization direction, in the light which has been transmitted through the first pupil region and has been converted into the circularly or elliptically polarized light; an imaging element that receives the light transmitted through the first pupil region and the second pupil region and has a plurality of pixel units each of which is a set of a first pixel receiving the light in the second polarization direction and a second pixel receiving the light in the third polarization direction; and an image generation unit that generates a first image corresponding to the light transmitted through the first pupil region and a second image corresponding to the light transmitted through the second pupil region on the basis of pixel signals of the first pixel and the second pixel.

According to this aspect, the first polarizer aligns the polarization direction of the light transmitted through the first pupil region and the second pupil region with the first polarization direction. Therefore, even in a case in which different images are generated on the basis of light having different polarization directions, it is possible to generate the images between which a difference in appearance caused by a difference between the polarization directions of the received light is suppressed. In addition, according to this aspect, the wave plate converts the linearly polarized light aligned in the first polarization direction into the circularly or elliptically polarized light. Therefore, the polarization directions of each light component forming the obtained images can be orthogonal to each other. The amounts of light of the obtained images do not depend on the polarization direction, and it is possible to obtain images having a uniform amount of light. Further, in this aspect, the second polarization direction and the third polarization direction are orthogonal to each other, and the first pixel receiving the light in the second polarization direction and the second pixel receiving the light in the third polarization direction are provided. Therefore, ideally, it is not necessary to perform the crosstalk removal process without mixing signals corresponding to the light in the second polarization direction and the light in the third polarization direction. Therefore, according to this aspect, it is possible to obtain appropriate first and second images without performing the crosstalk removal process.

Preferably, the imaging device further comprises: a first wavelength filter that transmits light in a first wavelength band in the light transmitted through the first pupil region; and a second wavelength filter that transmits light in a second wavelength band in the light transmitted through the second pupil region.

According to still another aspect of the invention, there is provided an imaging device comprising: an imaging optical system that has a pupil region including a first pupil region, a second pupil region different from the first pupil region, and a third pupil region different from the first pupil region and the second pupil region; a first polarizer that aligns a polarization direction of light transmitted through the first pupil region, the second pupil region, and the third pupil region with a first polarization direction; a wave plate that converts linearly polarized light aligned in the first polarization direction by the first polarizer into circularly or elliptically polarized light; a second polarizer that transmits light in a second polarization direction different from the first polarization direction in the light which has been transmitted through the first pupil region and has been converted into the circularly or elliptically polarized light; a third polarizer that transmits light in a third polarization direction different from the first polarization direction and the second polarization direction in the light which has been transmitted through the second pupil region and has been converted into the circularly or elliptically polarized light; a fourth polarizer that transmits light in a fourth polarization direction different from the first polarization direction, the second polarization direction, and the third polarization direction in the light which has been transmitted through the third pupil region and has been converted into the circularly or elliptically polarized light; an imaging element that receives the light transmitted through the first pupil region, the second pupil region, and the third pupil region and has a plurality of pixel units each of which is a set of a first pixel, a second pixel, and a third pixel receiving light in different polarization directions; and an image generation unit that performs a crosstalk removal process on pixel signals of the first pixel, the second pixel, and the third pixel and generates a first image corresponding to the light transmitted through the first pupil region, a second image corresponding to the light transmitted through the second pupil region, and a third image corresponding to the light transmitted through the third pupil region on the basis of the pixel signals subjected to the crosstalk removal process.

According to this, the first polarizer aligns the polarization direction of the light transmitted through the first pupil region, the second pupil region, and the third pupil region with the first polarization direction. Therefore, even in a case in which different images are generated on the basis of light having different polarization directions, it is possible to generate the images between which a difference in appearance caused by a difference between the polarization directions of the received light is suppressed. In addition, according to this aspect, the wave plate converts the linearly polarized light aligned in the first polarization direction into the circularly or elliptically polarized light. Therefore, it is possible to design the polarization direction of each light component forming the obtained images as any direction. The amounts of light of the obtained images do not depend on the polarization direction, and it is possible to obtain images having a uniform amount of light.

Preferably, the imaging device further comprises: a first wavelength filter that transmits light in a first wavelength band in the light transmitted through the first pupil region; a second wavelength filter that transmits light in a second wavelength band in the light transmitted through the second pupil region; and a third wavelength filter that transmits light in a third wavelength band in the light transmitted through the third pupil region.

Preferably, the wave plate is a ¼ wave plate.

Preferably, the first polarizer shields s-polarized light.

Preferably, the second polarizer transmits the light in the second polarization direction orthogonal to the first polarization direction in the light which has been transmitted through the first pupil region and has been converted into the circularly or elliptically polarized light.

Preferably, in the imaging element, the pixel unit includes a pixel including a polarization element.

Preferably, in the imaging element, the polarization element is provided between a photodiode and a microlens which constitute the pixel.

According to yet another aspect of the invention, there is provided an imaging method comprising: a step of causing a first polarizer to align a polarization direction of light transmitted through a first pupil region and a second pupil region of an imaging optical system, which has a pupil region including the first pupil region and the second pupil region different from the first pupil region, with a first polarization direction; a step of causing a wave plate to convert linearly polarized light aligned in the first polarization direction by the first polarizer into circularly or elliptically polarized light; a step of causing a second polarizer to transmit light in a second polarization direction different from the first polarization direction in the light which has been transmitted through the first pupil region and has been converted into the circularly or elliptically polarized light; a step of causing a third polarizer to transmit light in a third polarization direction different from the first polarization direction and the second polarization direction in the light which has been transmitted through the second pupil region and has been converted into the circularly or elliptically polarized light; and a step of performing a crosstalk removal process on pixel signals of a first pixel and a second pixel of an imaging element, which receives the light transmitted through the first pupil region and the second pupil region and has a plurality of pixel units each of which is a set of the first pixel and the second pixel receiving light in different polarization directions, and generating a first image corresponding to the light transmitted through the first pupil region and a second image corresponding to the light transmitted through the second pupil region on the basis of the pixel signals subjected to the crosstalk removal process.

According to still yet another aspect of the invention, there is provided an imaging method comprising: a step of causing a first polarizer to align a polarization direction of light transmitted through a first pupil region and a second pupil region of an imaging optical system, which has a pupil region including the first pupil region and the second pupil region different from the first pupil region, with a first polarization direction; a step of causing a wave plate to convert linearly polarized light aligned in the first polarization direction by the first polarizer into circularly or elliptically polarized light; a step of causing a second polarizer to transmit light in a second polarization direction different from the first polarization direction in the light which has been transmitted through the first pupil region and has been converted into the circularly or elliptically polarized light; a step of causing a third polarizer to transmit light in a third polarization direction, which is different from the first polarization direction and is orthogonal to the second polarization direction, in the light which has been transmitted through the first pupil region and has been converted into the circularly or elliptically polarized light; and a step of generating a first image corresponding to the light transmitted through the first pupil region and a second image corresponding to the light transmitted through the second pupil region on the basis of pixel signals of a first pixel and a second pixel of an imaging element which receives the light transmitted through the first pupil region and the second pupil region and has a plurality of pixel units each of which is a set of the first pixel receiving the light in the second polarization direction and the second pixel receiving the light in the third polarization direction.

According to yet still another aspect of the invention, there is provided an imaging method comprising: a step of causing a first polarizer to align a polarization direction of light transmitted through a first pupil region, a second pupil region, and a third pupil region of an imaging optical system, which has a pupil region including the first pupil region, the second pupil region different from the first pupil region, and the third pupil region different from the first pupil region and the second pupil region, with a first polarization direction; a step of causing a wave plate to convert linearly polarized light aligned in the first polarization direction by the first polarizer into circularly or elliptically polarized light; a step of causing a second polarizer to transmit light in a second polarization direction different from the first polarization direction in the light which has been transmitted through the first pupil region and has been converted into the circularly or elliptically polarized light; a step of causing a third polarizer to transmit light in a third polarization direction different from the first polarization direction and the second polarization direction in the light which has been transmitted through the second pupil region and has been converted into the circularly or elliptically polarized light; a step of causing a fourth polarizer to transmit light in a fourth polarization direction different from the first polarization direction, the second polarization direction, and the third polarization direction in the light which has been transmitted through the third pupil region and has been converted into the circularly or elliptically polarized light; and a step of performing a crosstalk removal process on pixel signals of a first pixel, a second pixel, and a third pixel of an imaging element, which receives the light transmitted through the first pupil region, the second pupil region, and the third pupil region and has a plurality of pixel units each of which is a set of the first pixel, the second pixel, and the third pixel receiving light in different polarization directions, and generating a first image corresponding to the light transmitted through the first pupil region, a second image corresponding to the light transmitted through the second pupil region, and a third image corresponding to the light transmitted through the third pupil region on the basis of the pixel signals subjected to the crosstalk removal process.

According to the invention, the first polarizer aligns the polarization direction of the light transmitted through the first pupil region and the second pupil region with the first polarization direction. Therefore, even in a case in which different images are generated on the basis of light having different polarization directions, it is possible to generate the images between which the difference in appearance caused by the difference between the polarization directions of the received light is suppressed. In addition, the wave plate converts the linearly polarized light aligned in the first polarization direction into the circularly or elliptically polarized light. Therefore, it is possible to design the polarization direction of each light component forming the obtained images as any direction. The amounts of light of the obtained images do not depend on the polarization direction, and it is possible to obtain images having a uniform amount of light.

BRIEF DESCRIPTION OF THE DRAWINGS

FIG. 16 is a flowchart illustrating a processing flow of an imaging method.

FIG. 24 is a diagram illustrating a schematic configuration of an imaging device.

DESCRIPTION OF THE PREFERRED EMBODIMENTS

Hereinafter, preferred embodiments of the invention will be described in detail with reference to the accompanying drawings.

First Embodiment

Figure 1:
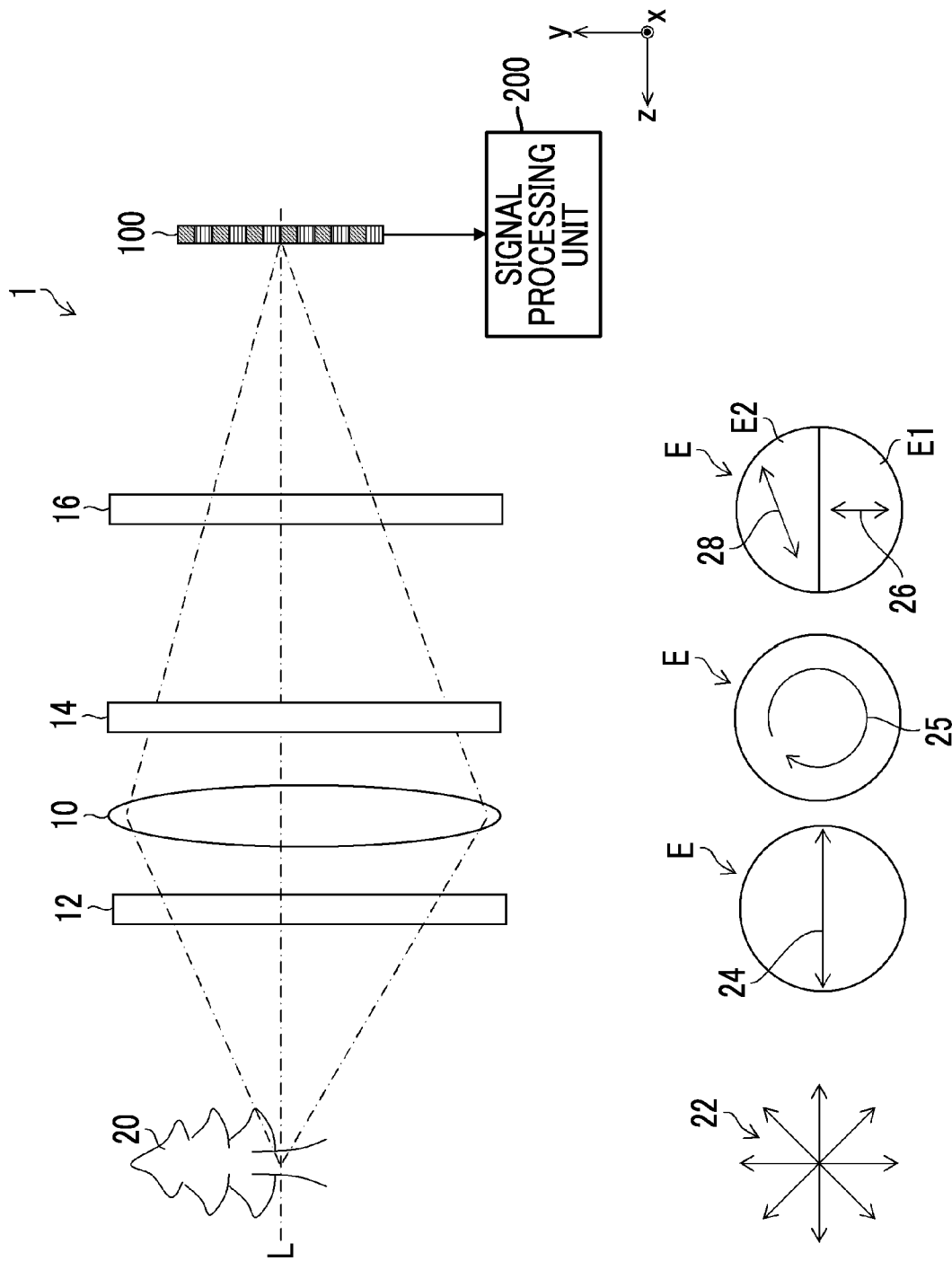
FIG. 1 is a diagram illustrating a schematic configuration of an imaging device.

FIG. 1 is a diagram illustrating a schematic configuration of an imaging device 1 according to a first embodiment. In this embodiment, two independent images are acquired by using two different polarization directions (a second polarization direction 26 and a third polarization direction 28).

As illustrated in FIG. 1, the imaging device 1 according to this embodiment comprises an imaging optical system 10, a first polarization filter (first polarizer) 12, a wave plate 14, a second polarization filter (a second polarizer and a third polarizer) 16, an imaging element 100, and a signal processing unit 200. In addition, in FIG. 1, a polarization direction 22 of natural light reflected by an object 20, a first polarization direction 24 which is a polarization direction of light transmitted through the first polarization filter 12, circularly polarized light 25 converted by the wave plate 14, and the second and third polarization directions 26 and 28 which are the polarization directions of light transmitted through the second polarization filter 16 are illustrated below the first polarization filter 12, the wave plate 14, and the second polarization filter 16 together with a pupil region E of the imaging optical system 10.

Light reflected by the object 20 includes all of the polarization directions 22. This light is captured by the imaging optical system 10. The pupil region E of the imaging optical system 10 includes a first pupil region E1 and a second pupil region E2. The first pupil region E1 and the second pupil region E2 can be determined in any manner. For example, as illustrated in FIG. 1, the pupil region E may be divided into two regions in the vertical direction. One of the two regions may be the first pupil region E1 and the other of the two regions may be the second pupil region E2. In this case, a parallax image can be obtained from an image based on light transmitted through the first pupil region E1 and an image based on light transmitted through the second pupil region E2. Further, for example, the pupil region E may be divided into two regions in the horizontal direction orthogonal to the vertical direction. One of the two regions may be the first pupil region E1 and the other of the two regions may be the second pupil region E2.

The light transmitted through the first pupil region E1 and the second pupil region E2 is incident on the first polarization filter (first polarizer) 12 which is provided at a pupil position or near the pupil position and is transmitted through the first polarization filter 12. The light transmitted through the first pupil region E1 and the second pupil region E2 is linearly polarized in the first polarization direction 24 by the first polarization filter 12. Then, the linearly polarized light aligned in the first polarization direction 24 is converted into the circularly polarized light 25 by the wave plate 14. Then, light in the second polarization direction 26 and light in the third polarization direction 28 are transmitted through each half pupil region (the first pupil region E1 and the second pupil region E2) of the pupil region E by the second polarization filter 16. Then, the imaging element 100 receives the light in the second polarization direction 26 and the light in the third polarization direction 28.

[First Polarization Filter]

Figure 2:
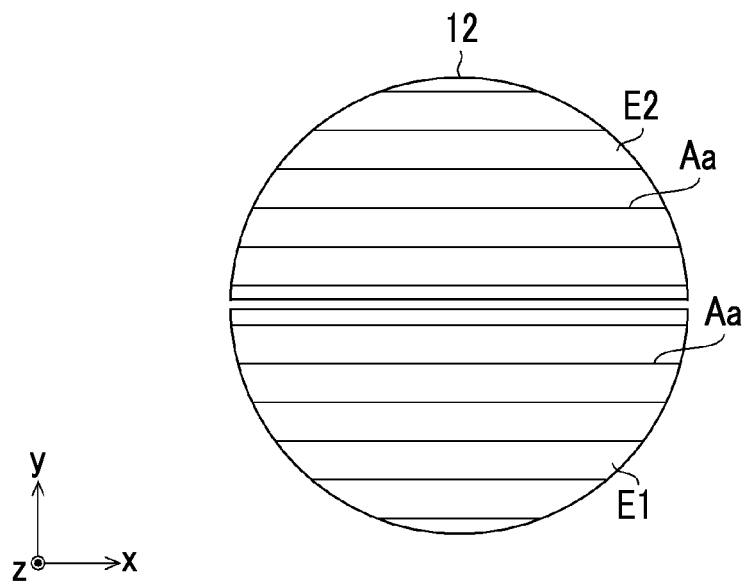
FIG. 2 is a front view illustrating a schematic configuration of a first polarization filter.

FIG. 2 is a front view illustrating a schematic configuration of the first polarization filter 12. The first polarization filter 12 has the function of the first polarizer and is provided at or near the pupil position of the imaging optical system 10 as illustrated in FIG. 1. Then, the polarization direction of the light transmitted through the first pupil region E1 and the second pupil region E2 is aligned with the first polarization direction 24. For example, a polarization filter that is provided with a polarization transmission axis so as to shield s-polarized light is used as the first polarization filter 12. The use of the polarization filter that shields s-polarized light as the first polarization filter 12 makes it possible to prevent a difference in appearance between a plurality of images obtained by light reflected from, for example, a water surface due to the reflected light. In addition, the polarization transmission axis of the first polarization filter 12 is represented by reference letters Aa.

[Wave Plate]

Figure 3:
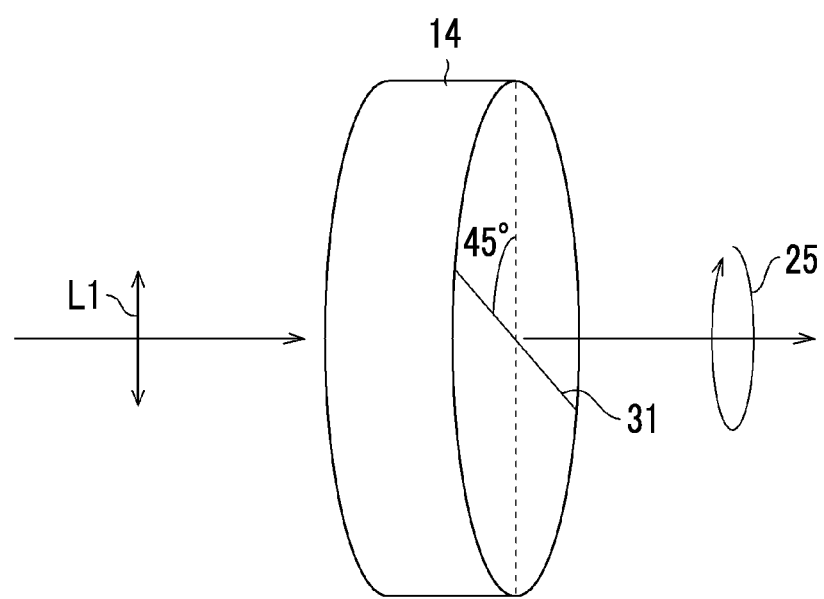
FIG. 3 is a diagram illustrating a schematic configuration of a wave plate.

FIG. 3 is a diagram illustrating a schematic configuration of the wave plate 14. Linearly polarized light L1 having the first polarization direction 24 is incident on the wave plate 14, and the circularly polarized light 25 is emitted from the wave plate 14. The wave plate 14 converts the linearly polarized light L1 into the circularly polarized light 25 and emits the circularly polarized light 25. A ¼λ plate is used as the wave plate 14. In a case in which the angle formed between the first polarization direction 24 and an optical axis 31 is 45°, the light emitted from the wave plate 14 is the circularly polarized light 25. Further, in a case in which the angle formed between the linearly polarized light L1 having the first polarization direction 24 and the optical axis 31 of the wave plate 14 is not 45°, the wave plate 14 emits elliptically polarized light. The linearly polarized light L1 having the first polarization direction 24 is converted into the circularly polarized light 25 by the wave plate 14 to improve flexibility in the design of the polarization direction of the second polarization filter 16. That is, even in a case in which the second polarization filter 16 is designed so as to transmit light in a polarization direction orthogonal to the first polarization direction 24 or a polarization direction close to the orthogonal direction to the first polarization direction 24, it is possible to suppress the shielding of light incident on the second polarization filter 16 or an extreme decrease in the amount of light, and flexibility in the design of the polarization direction of the second polarization filter 16 is improved. Here, the term "close to the orthogonal direction" means a range of ±20°, preferably, ±10° from the orthogonal direction. In addition, the conversion of the linearly polarized light L1 into the circularly polarized light 25 by the wave plate 14 makes it possible to eliminate the dependence of the amount of obtained light on the polarization direction and to maintain the uniformity of the amount of light of a plurality of obtained images.

[Second Polarization Filter]

Figure 4:
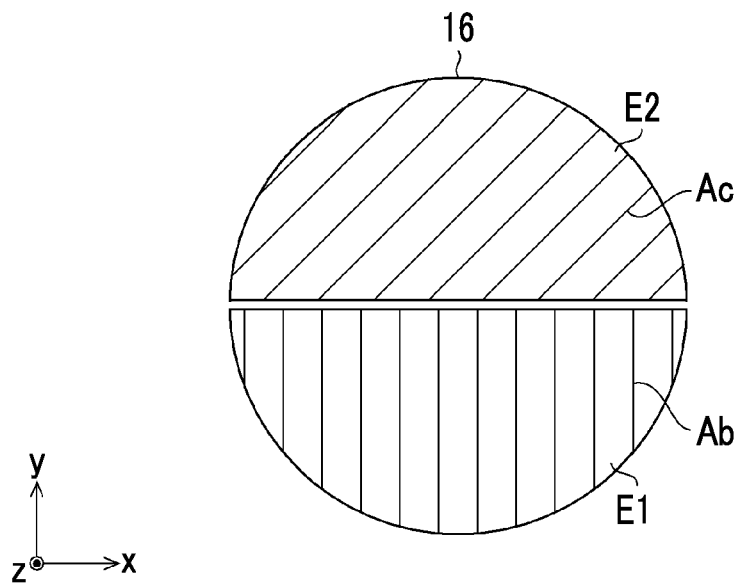
FIG. 4 is a front view illustrating a schematic configuration of a second polarization filter.

FIG. 4 is a front view illustrating a schematic configuration of the second polarization filter 16. The second polarization filter 16 has the functions of the second polarizer and the third polarizer. A portion of the second polarization filter 16 which has the function of the second polarizer transmits light in the second polarization direction 26 different from the first polarization direction 24 in the light which has been transmitted through the first pupil region E1 and has been converted into the circularly or elliptically polarized light. In addition, a portion of the second polarization filter 16 which has the function of the third polarizer transmits light in the third polarization direction 28 different from the first polarization direction 24 and the second polarization direction 26 in the light which has been transmitted through the second pupil region E2 and has been converted into the circularly or elliptically polarized light. Further, the polarization transmission axes of the second polarization filter 16 are represented by reference letters Ab and Ac.

Figure 5:
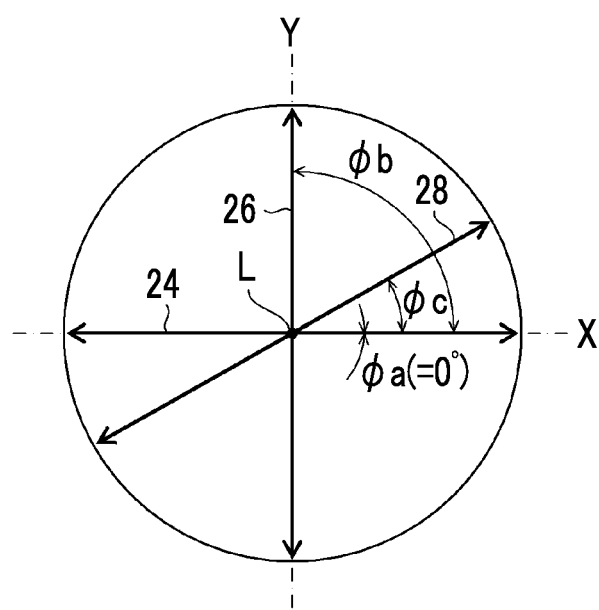
FIG. 5 is a diagram illustrating an example of a first polarization direction, a second polarization direction, and a third polarization direction.

FIG. 5 is a diagram illustrating an example of the first polarization direction 24, the second polarization direction 26, and the third polarization direction 28.

The polarization direction is represented by an angle Φa (azimuth angle) formed between the polarization transmission axis (Aa) of the first polarization filter 12 and the X-axis and angles Φb and Φc (azimuth angles) formed between the X-axis and the polarization transmission axis (Ab) and the polarization transmission axis (Ac) of the second polarization filter 16 in the XY plane orthogonal to an optical axis L. As illustrated in FIG. 5, the first polarization filter 12 is configured to transmit light having an angle Φa of 0° (azimuth angle 0°) formed between the polarization transmission axis Aa and the X-axis. Further, the second polarization filter 16 transmits light having an angle Φb of 90° (azimuth angle 90°) formed between the polarization transmission axis Ab and the X-axis in the first pupil region E1 and transmits light having an angle Φb of 30° (azimuth angle 30°) formed between the polarization transmission axis Ac and the X-axis in the second pupil region E2. Therefore, the angle formed between the first polarization direction 24 and the X-axis is 0°, the angle formed between the second polarization direction 26 and the X-axis is 90°, and the angle formed between the third polarization direction 28 and the X-axis is 30°. Further, in the case illustrated in FIG. 5, the second polarization direction 26 orthogonal to the first polarization direction 24 can be adopted.

[Imaging Element]

Figure 6:
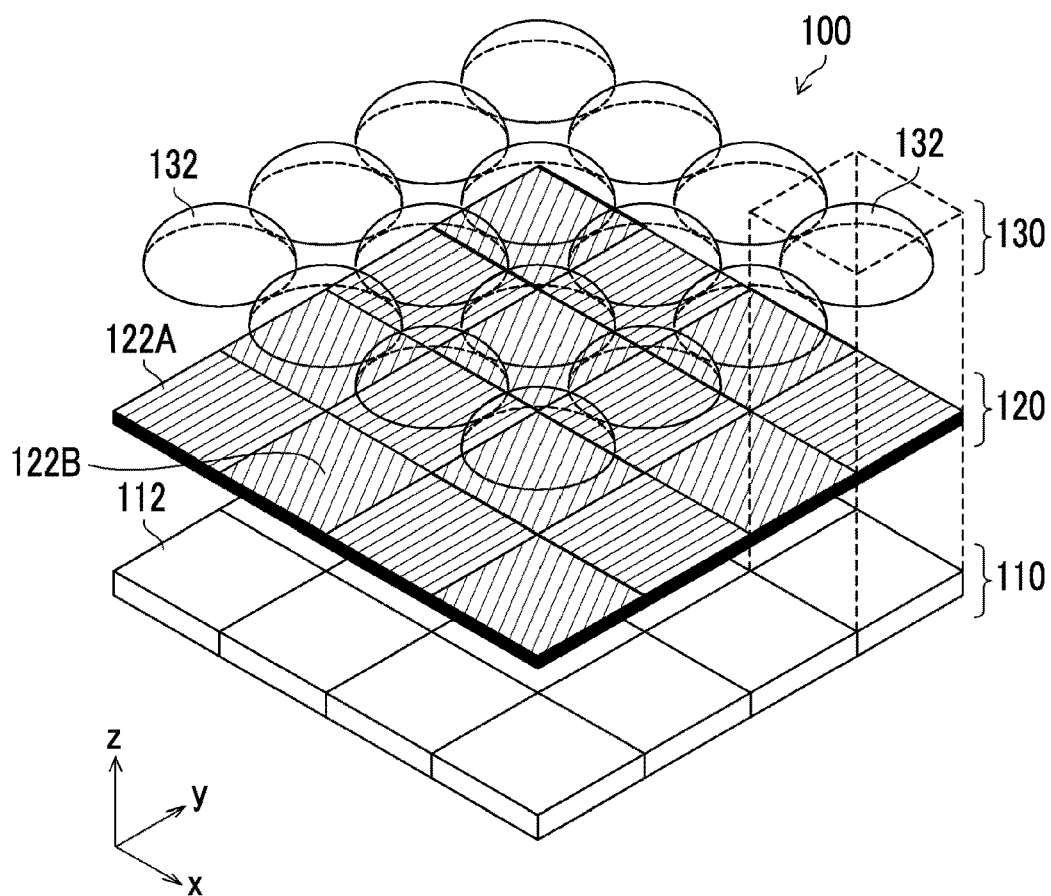
FIG. 6 is a diagram illustrating a schematic configuration of an imaging element.
Figure 7:
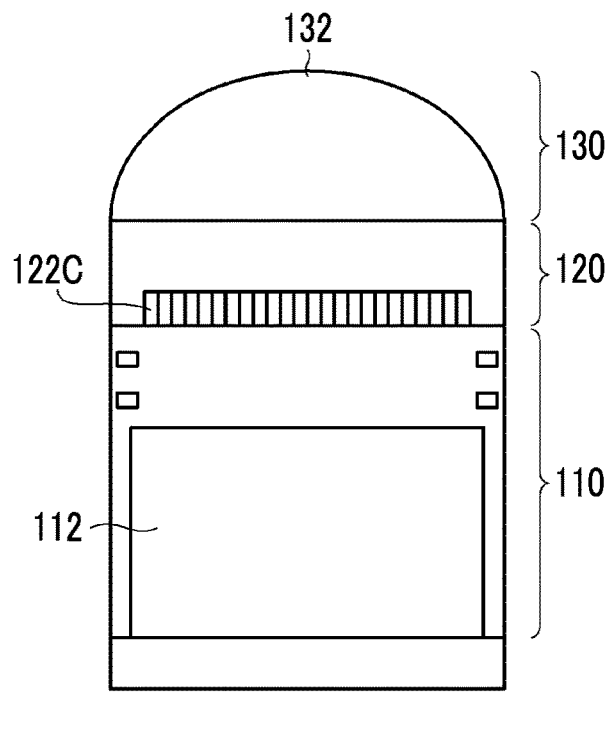
FIG. 7 is a cross-sectional view illustrating a schematic configuration of one pixel.

FIG. 6 is a diagram illustrating a schematic configuration of the imaging element 100 and is an exploded and enlarged view of a portion of the imaging element 100. FIG. 7 is a cross-sectional view illustrating a schematic configuration of one pixel (a portion represented by a dashed line in FIG. 6).

As illustrated in FIG. 6, the imaging element 100 has a pixel array layer 110, a polarization element array layer 120, and a microlens array layer 130.

The pixel array layer 110 is configured by two-dimensionally arranging a large number of photodiodes 112. One photodiode 112 constitutes one pixel. The photodiodes 112 are regularly arranged along the x-axis direction and the y-axis direction.

The polarization element array layer 120 is provided between the pixel array layer 110 and the microlens array layer 130. The polarization element array layer 120 is configured by two-dimensionally arranging two types of polarization elements 122A and 122B. Each of the polarization elements 122A and 122B is disposed at the same interval as the photodiodes 112 and is comprised in each pixel. Therefore, one photodiode 112 comprises any one of two types of polarization elements 122A and 122B.

Figure 8:
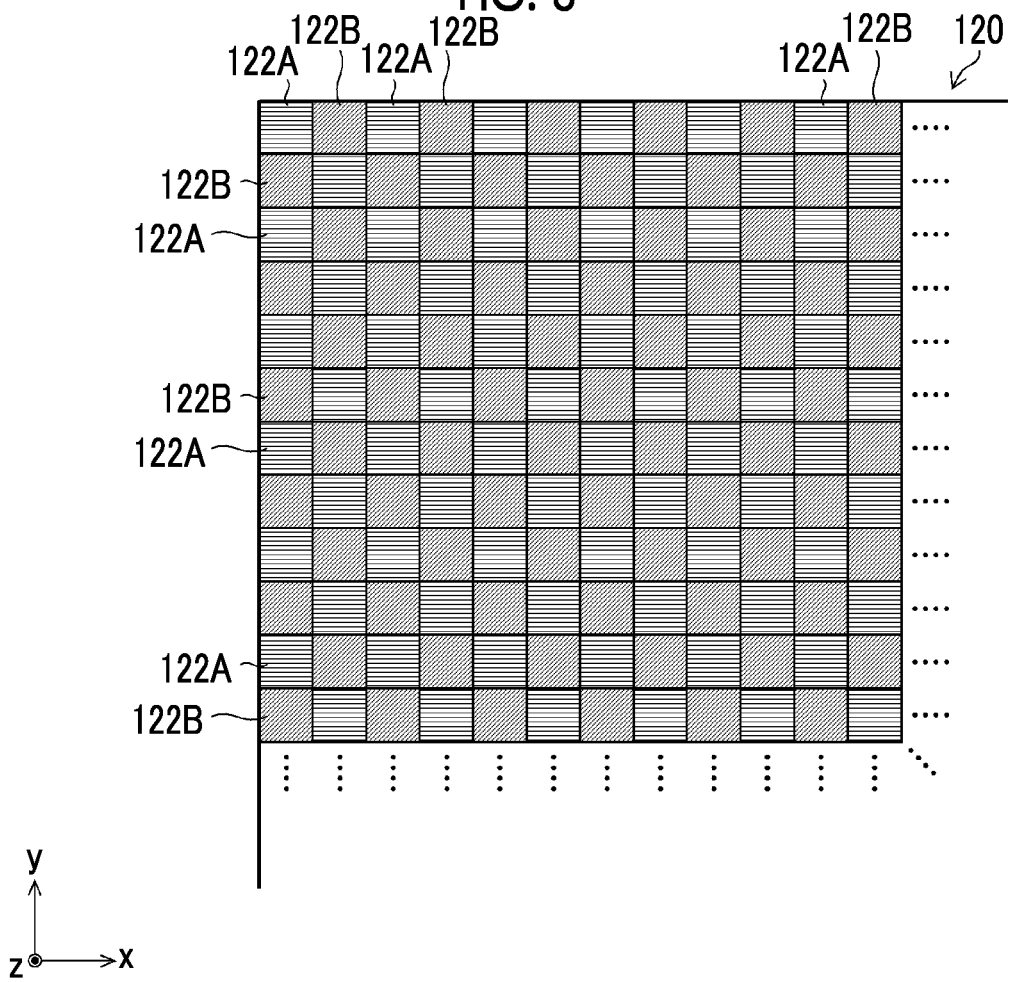
FIG. 8 is a diagram illustrating an example of the arrangement pattern of two types of polarization elements.

FIG. 8 is a diagram illustrating an example of the arrangement pattern of two types of polarization elements.

As illustrated in FIG. 8, the two types of polarization elements 122A and 122B are regularly arranged in a predetermined order along the x-axis direction and the y-axis direction.

In the example illustrated in FIG. 8, the first polarization elements 122A and the second polarization elements 122B are regularly arranged in a predetermined pattern by alternately arranging a row in which the first polarization element 122A and the second polarization element 122B are repeatedly arranged in this order and a row in which the second polarization element 122B and the first polarization element 122A are repeatedly arranged in this order. For the first polarization elements 122A and the second polarization elements 122B arranged in this way, a set of two types of polarization elements (one first polarization element 122A and one second polarization element 122B) constitutes one unit, and the units are regularly arranged along the x-axis direction and the y-axis direction.

Figure 9:
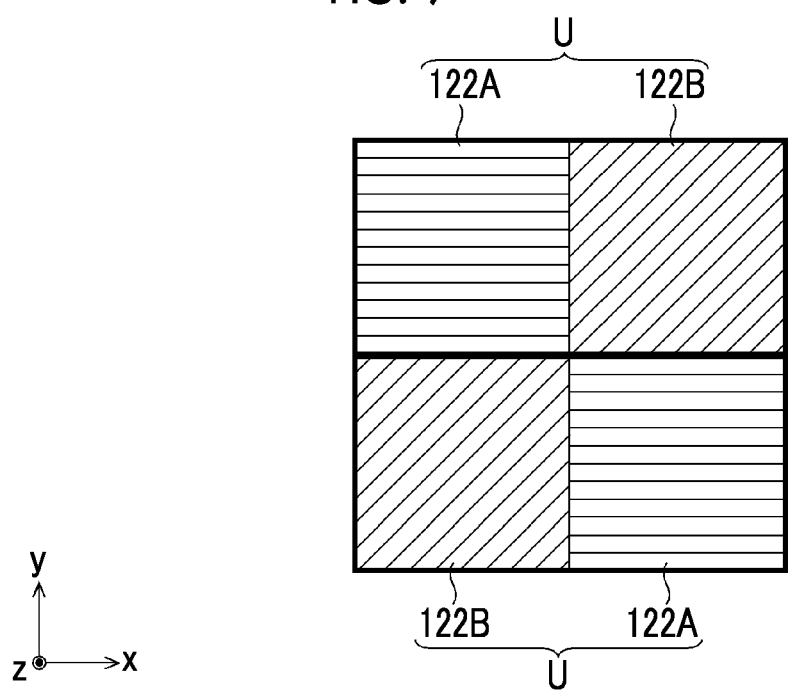
FIG. 9 is a diagram illustrating a configuration of one unit of the polarization elements.

FIG. 9 is a diagram illustrating the configuration of one unit of the polarization elements.

As illustrated in FIG. 9, one unit U includes one first polarization element 122A and one second polarization element 122B.

As described above, the first polarization element 122A and the second polarization element 122B have different polarization directions. In this embodiment, the first polarization element 122A is configured to transmit light having an azimuth angle of +0° The second polarization element 122B is configured to transmit light having an azimuth angle of +45°. Therefore, the photodiode 112 comprising the first polarization element 122A receives the light (linearly polarized light) having an azimuth angle of +0°. The photodiode 112 comprising the second polarization element 122B receives the light (linearly polarized light) having an azimuth angle of +45°.

The microlens array layer 130 is configured by two-dimensionally arranging a large number of microlenses 132. Each of the microlenses 132 is disposed at the same interval as the photodiodes 112 and is comprised in each pixel. The microlens 132 is comprised in order to efficiently focus light from the imaging optical system 10 on the photodiode 112.

Figure 10:
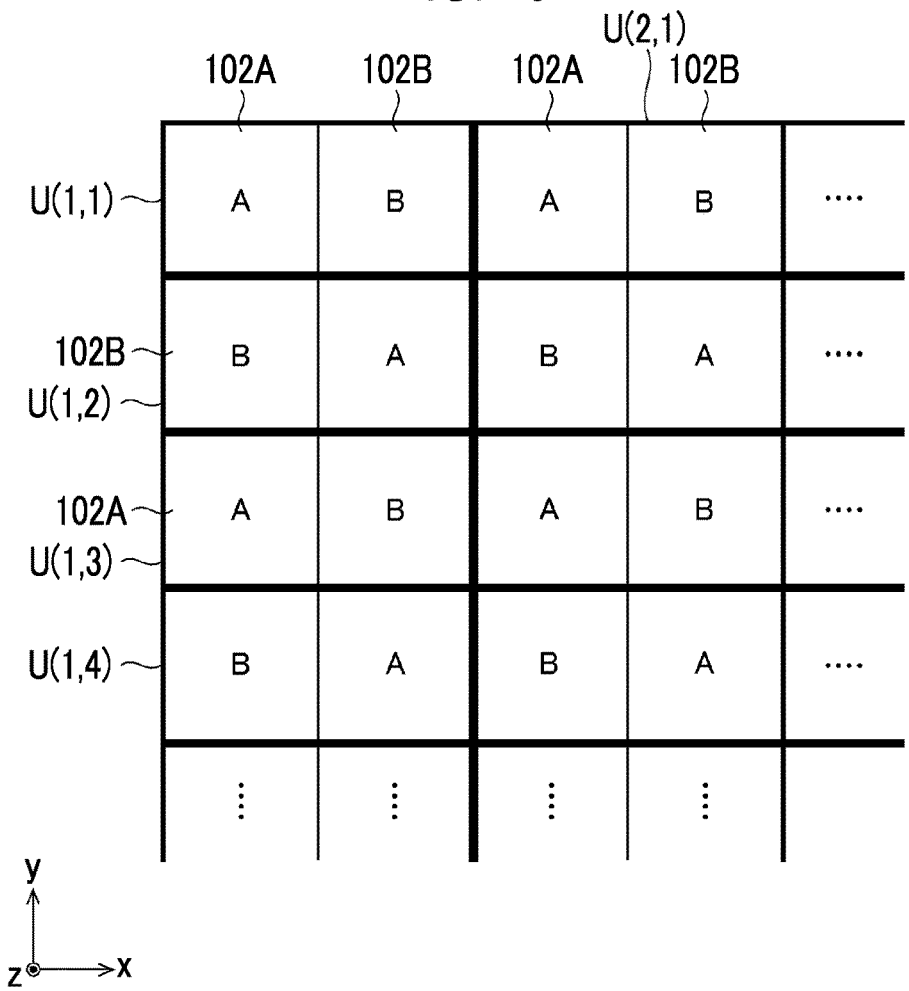
FIG. 10 is a diagram illustrating an example of the arrangement of pixels in the imaging element.

FIG. 10 is a diagram illustrating an example of the arrangement of the pixels in the imaging element 100.

Each pixel comprises the first polarization element 122A or the second polarization element 122B. It is assumed that the pixel (the image of A in FIG. 10) comprising the first polarization element 122A is a first pixel 102A and the pixel (the image of B in FIG. 10) comprising the second polarization element 122B is a second pixel 102B. The imaging element 100 has a plurality of units each of which is a set of two pixels including one first pixel 102A and one second pixel 102B. The unit which is a set of two pixels is referred to as a pixel unit U(x, y). As illustrated in FIG. 10, the pixel units U(x, y) are regularly arranged along the x-axis direction and the y-axis direction.

[Signal Processing Unit]

The signal processing unit 200 processes the signal output from the imaging element 100 to generate a first image corresponding to the light transmitted through the first pupil region E1 and a second image corresponding to the light transmitted through the second pupil region E2.

Figure 11:
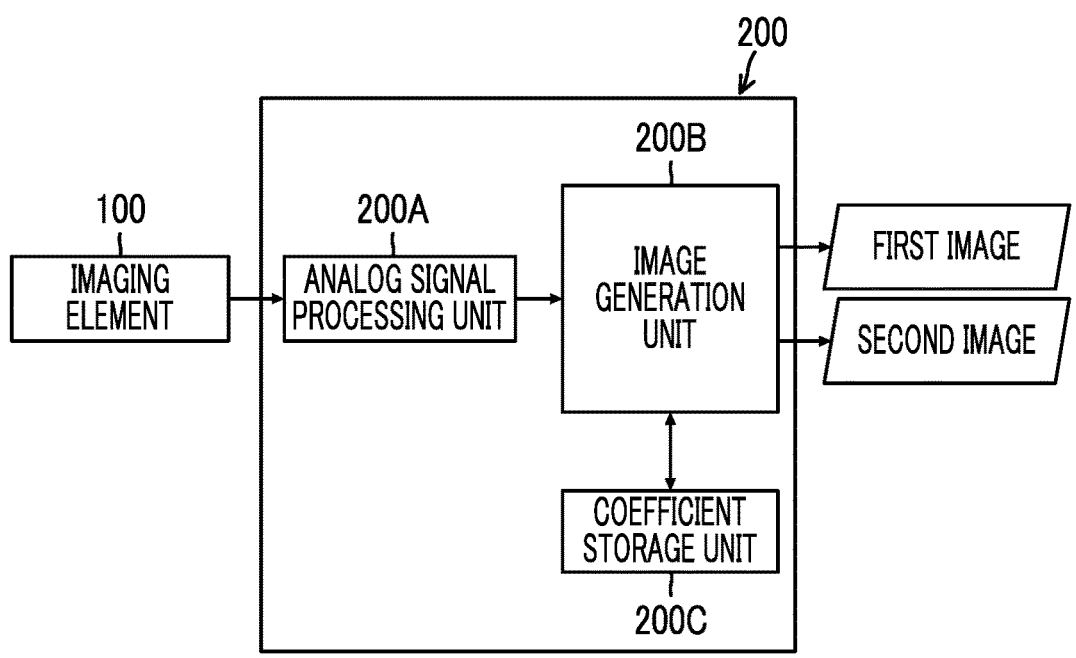
FIG. 11 is a block diagram illustrating a schematic configuration of a signal processing unit.

FIG. 11 is a block diagram illustrating a schematic configuration of the signal processing unit 200.

As illustrated in FIG. 11, the signal processing unit 200 includes an analog signal processing unit 200A, an image generation unit 200B, and a coefficient storage unit 200C.

The analog signal processing unit 200A acquires an analog pixel signal output from each pixel of the imaging element 100, performs predetermined signal processing (for example, a correlated double sampling process or an amplification process), converts the analog pixel signal into a digital signal, and outputs the digital signal.

The image generation unit 200B performs predetermined signal processing on the pixel signal converted into the digital signal to generate the images corresponding to the light transmitted through the first pupil region E1 and the light transmitted through the second pupil region E2.

Figure 12:
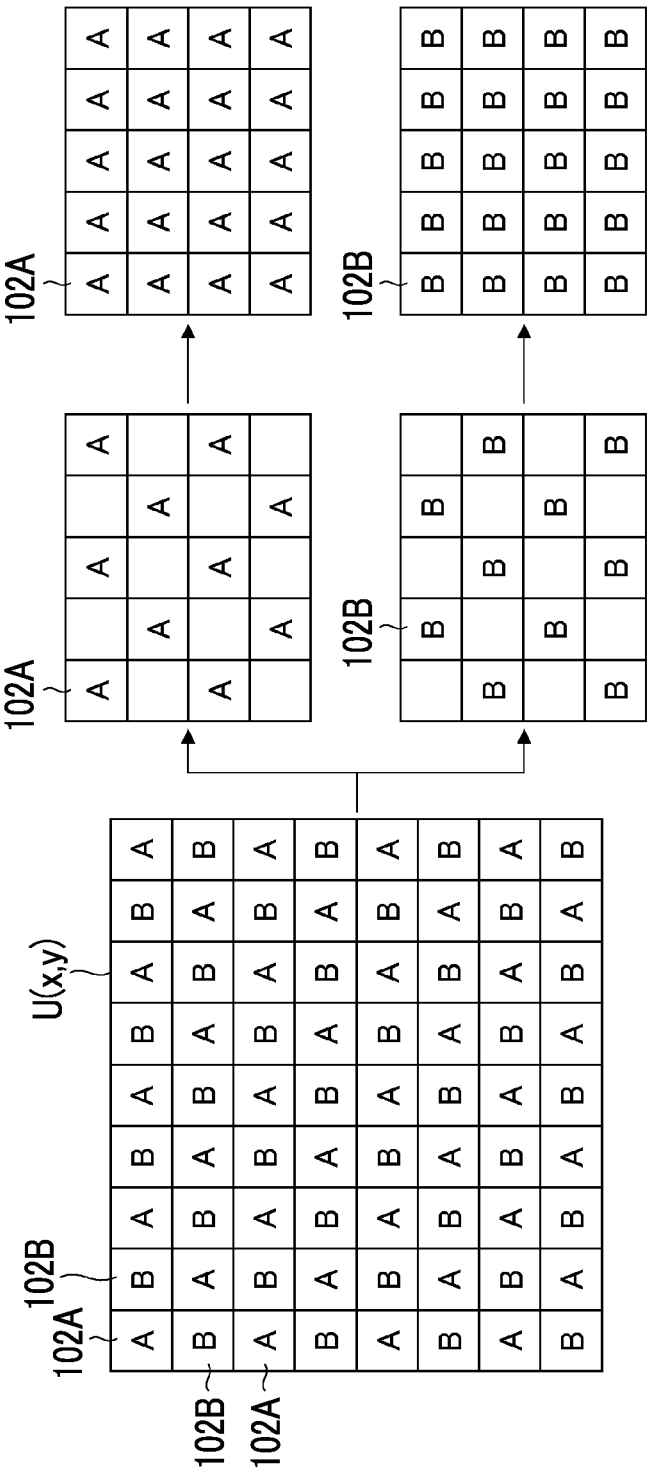
FIG. 12 is a conceptual diagram illustrating image generation.

FIG. 12 is a conceptual diagram illustrating image generation.

Each pixel unit U(x, y) includes one first pixel 102A and one second pixel 102B. Therefore, two images (the first image and the second image) are generated by separating and extracting the pixel signals of the first pixel 102A and the second pixel 102B from each pixel unit U(x, y). That is, the first image configured by extracting the pixel signal from the first pixel 102A of each pixel unit U (x, y) and the second image configured by extracting the pixel signal of the second pixel 102B of each pixel unit U (x, y) are generated.

However, as described above, the light received by the first pixel 102A includes light in the second polarization direction 26 (light transmitted through the first pupil region E1) and light in the third polarization direction 28 (light transmitted through the second pupil region E2). In addition, the light received by the second pixel 102B includes light in the second polarization direction 26 (light transmitted through the first pupil region E1) and light in the third polarization direction 28 (light transmitted through the second pupil region E2). That is, the light in the second polarization direction 26 and the light in the third polarization direction 28 are incident on the first pixel 102A and the second pixel 102B while being mixed with each other.

Therefore, the image generation unit 200B performs a process of removing crosstalk (crosstalk removal process) to generate the first image corresponding to the light transmitted through the first pupil region E1 and the second image corresponding to the light transmitted through the second pupil region E2. The crosstalk removal process is performed as follows.

Here, it is assumed that the pixel signal (signal value) obtained by the first pixel 102A is x1 and the pixel signal obtained by the second pixel 102B is x2. Two pixel signals x1 and x2 are obtained from each pixel unit U(x, y). The image generation unit 200B calculates pixel signals X1 and X2 corresponding to the second polarization direction 26 and the third polarization direction 28 from the two pixel signals x1 and x2 with the following Expression 1 using a matrix A to remove crosstalk.

$$A = \begin{pmatrix} a11 & a12 \\ a21 & a22 \end{pmatrix}$$

$$\begin{pmatrix} X1 \\ X2 \end{pmatrix} = \begin{pmatrix} a11 & a12 \\ a21 & a22 \end{pmatrix} * \begin{pmatrix} x1 \\ x2 \end{pmatrix} \quad \text{(Expression 1)}$$

The reason why the pixel signals X1 and X2 of the images corresponding to the light in the second polarization direction 26 and the light in the third polarization direction 28 can be calculated by Expression 1, that is, the reason why crosstalk can be removed will be described below.

The ratio (the amount of crosstalk (also referred to as a crosstalk ratio)) at which the light transmitted through the first pupil region E1 and the second pupil region E2 is received by the first pixel 102A and the second pixel 102B is uniquely determined from the relationship between the polarization direction (the second polarization direction 26 and the third polarization direction 28) and the polarization directions of the first polarization element 122A and the second polarization element 122B comprised in the first pixel 102A and the second pixel 102B.

Here, assuming that the ratio at which the light in the second polarization direction 26 is received by the first pixel 102A is b11 and the ratio at which the light in the third polarization direction 28 is received by the first pixel 102A is b12, the following relationship is established between x1 and X1 and X2.

$$b11*X1+b12*X2=x1 \quad \text{(Expression 2)}$$

Further, assuming that the ratio at which the light in the second polarization direction 26 is received by the second pixel 102B is b21 and the ratio at which the light in the third polarization direction 28 is received by the second pixel 102B is b22, the following relationship is established between x2 and X1 and X2.

$$b21*X1+b22*X2=x2 \quad \text{(Expression 3)}$$

For X1 and X2, the simultaneous equations of Expressions 2 and 3 can be solved to acquire the pixel signals of the original images, that is, the pixel signals X1 and X2 of the image of the light in the second polarization direction 26 and the image of the light in the third polarization direction 28.

Here, the above-mentioned simultaneous equations can be represented by the following Expression 4 using a matrix B.

$$B = \begin{pmatrix} b11 & b12 \\ b21 & b22 \end{pmatrix} \quad \text{(Expression 4)}$$

$$\begin{pmatrix} b11 & b12 \\ b21 & b22 \end{pmatrix} * \begin{pmatrix} X1 \\ X2 \end{pmatrix} = \begin{pmatrix} x1 \\ x2 \end{pmatrix}$$

X1 and X2 are calculated by multiplying both sides by an inverse matrix $B^{-1}$ of the matrix B.

$$\begin{pmatrix} b11 & b12 \\ b21 & b22 \end{pmatrix}^{-1} * \begin{pmatrix} b11 & b12 \\ b21 & b22 \end{pmatrix} * \begin{pmatrix} X1 \\ X2 \end{pmatrix} = \begin{pmatrix} b11 & b12 \\ b21 & b22 \end{pmatrix}^{-1} * \begin{pmatrix} x1 \\ x2 \end{pmatrix}$$

$$\begin{pmatrix} X1 \\ X2 \end{pmatrix} = \begin{pmatrix} b11 & b12 \\ b21 & b22 \end{pmatrix}^{-1} * \begin{pmatrix} x1 \\ x2 \end{pmatrix}$$

As such, the pixel signal X1 of the image obtained by the light transmitted through the first pupil region E1 and the pixel signal X2 of the image obtained by the light transmitted through the second pupil region E2 are calculated from the pixel signals x1 and x2 of the first pixel 102A and the second pixel 102B on the basis of the amount of light in the second polarization direction 26 and the amount of light in the third polarization direction 28 received by the first pixel 102A and the second pixel 102B.

The matrix A in Expression 1 is the inverse matrix $B^{-1}$ of the matrix B ($A=B^{-1}$). Therefore, each element aij (i=1, 2; j=1, 2) of the matrix A can be acquired by calculating the inverse matrix $B^{-1}$ of the matrix B. Each element bij (i=1, 2; j=1, 2) of the matrix B is the amount (the amount of crosstalk) of light in the second polarization direction 26 and the amount of light in the third polarization direction 28 received by the first pixel 102A and the second pixel 102B.

That is, in the first row, the element b11 is the amount (the amount of crosstalk) of light in the second polarization direction 26 received by the first pixel 102A and the element b12 is the amount of light in the third polarization direction 28 received by the first pixel 102A.

In addition, in the second row, the element b21 is the amount of light in the second polarization direction 26 received by the second pixel 102B and the element b22 is the amount of light in the third polarization direction 28 received by the second pixel 102B. The inverse matrix $B^{-1}$ of the matrix B exists. Therefore, the calculation of the inverse matrix $B^{-1}$ of the matrix B makes it possible to calculate each element of the matrix A.

The ratio (the amount of crosstalk) at which the light transmitted through the first pupil region E1 and the light transmitted through the second pupil region E2 are received by each of the pixels 102A and 102B is calculated by the square of the cosine (cos) of an angular difference between the polarization direction of the light transmitted through the first pupil region E1 and the light transmitted through the second pupil region E2 and the polarization direction of the light received by the first pixel 102A and the second pixel 102B. Therefore, for example, assuming that the polarization direction (azimuth angle) of the light (linearly polarized light) transmitted through the first pupil region E1 (or the second pupil region E2) is a and the polarization direction (azimuth angle) of the light received by an i-th pixel is 3, the ratio is calculated by $\cos^2(|\alpha-\beta|)$.

Figure 13A:
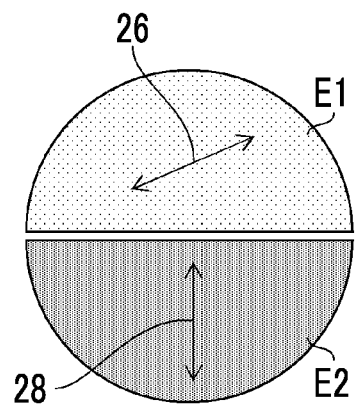
FIGS. 13A and 13B are diagrams illustrating an example of the calculation of the matrix A.
Figure 13B:
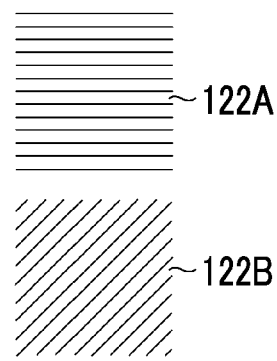
Figure 14A:
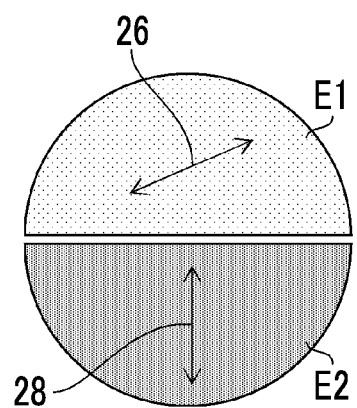
FIGS. 14A and 14B are diagrams illustrating an example of the calculation of the matrix A.
Figure 14B:
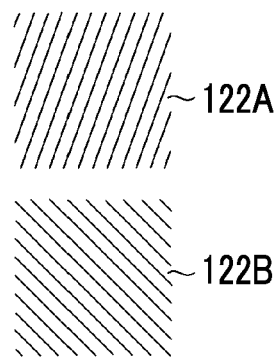
Figure 15A:
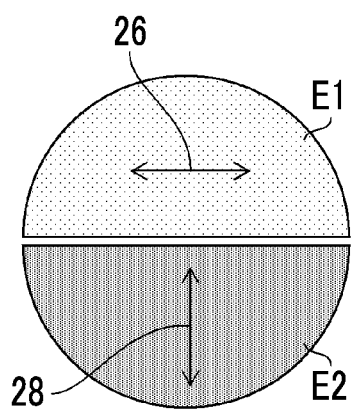
FIGS. 15A and 15B are diagrams illustrating an example of the calculation of the matrix A.
Figure 15B:
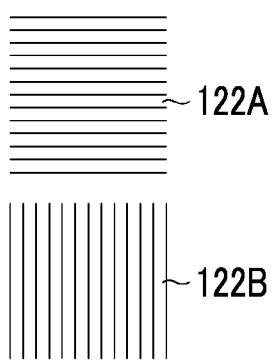

FIGS. 13A to 15B are diagrams illustrating examples of the calculation of the above-mentioned matrix A. In FIGS. 13A to 15B, the second polarization direction 26 of the light transmitted through the first pupil region E1 and the third polarization direction 28 of the light transmitted through the second pupil region E2 are illustrated (FIGS. 13A, 14A, and 15A). Further, in FIGS. 13A to 15B, the polarization directions of the first polarization element 122A and the second polarization element 122B are illustrated (FIGS. 13B, 14B, and 15B).

In the case illustrated in FIGS. 13A and 13B, the light transmitted through the first pupil region E1 is incident on the imaging element 100 as linearly polarized light having a polarization direction of 30°, and the light transmitted through the second pupil region E2 is incident on the imaging element 100 as linearly polarized light having a polarization direction of 90°. Further, the first polarization element 122A transmits light having a polarization direction of 0°, and the second polarization element 122B transmits light having a polarization direction of 45°.

Therefore, in this case, each element of the matrix B is as follows: b11=0.7500; b12=0.0000; b21=0.9330; and b22=0.5000.

$$B = \begin{pmatrix} 0.7500 & 0.0000 \\ 0.9330 & 0.5000 \end{pmatrix}$$

The inverse matrix $B^{-1}$ (matrix A) of the matrix B exists and has the following elements: a11=1.3333; a12=0; a21=−2.4880; and a22=2.0000.

$$B^{-1} = \begin{pmatrix} 1.3333 & 0 \\ -2.4880 & 2.0000 \end{pmatrix} = A$$

The coefficient storage unit 200C stores, as a coefficient group, each element of the matrix A of two rows and two columns calculated as the inverse matrix $B^{-1}$ of the matrix B. The coefficient storage unit 200C is an example of a storage unit.

In the case illustrated in FIGS. 14A and 14B, the light transmitted through the first pupil region E1 is incident on the imaging element 100 as linearly polarized light having a polarization direction of 30°, and the light transmitted through the second pupil region E2 is incident on the imaging element 100 as linearly polarized light having a polarization direction of 90°. Further, the first polarization element 122A transmits light having a polarization direction of 60°, and the second polarization element 122B transmits light having a polarization direction of 135°.

Therefore, in this case, each element of the matrix B is as follows: b11=0.7500; b12=0.7500; b21=0.0670; and b22=0.5000.

$$B = \begin{pmatrix} 0.7500 & 0.7500 \\ 0.0670 & 0.5000 \end{pmatrix}$$

The inverse matrix $B^{-1}$ (matrix A) of the matrix B exists and has the following elements: a11=1.5396; a12=−2.3094; a21=−0.2063; and a22=2.3094.

$$B^{-1} = \begin{pmatrix} 1.5396 & -2.3094 \\ -0.2063 & 2.3094 \end{pmatrix} = A$$

The coefficient storage unit 200C stores, as a coefficient group, each element of the matrix A of two rows and two columns calculated as the inverse matrix $B^{-1}$ of the matrix B. The coefficient storage unit 200C is an example of the storage unit.

In the case illustrated in FIGS. 15A and 15B, the light transmitted through the first pupil region E1 is incident on the imaging element 100 as linearly polarized light having a polarization direction of 0°, and the light transmitted through the second pupil region E2 is incident on the imaging element 100 as linearly polarized light having a polarization direction of 90°. Further, the first polarization element 122A transmits light having a polarization direction of 0°, and the second polarization element 122B transmits light having a polarization direction of 90°. In the case illustrated in FIGS. 15A and 15B, the polarization direction (second polarization direction 26) of the light transmitted through the first pupil region E1 and the polarization direction (third polarization direction 28) of the light transmitted through the second pupil region E2 may be orthogonal to each other. In addition, the polarization direction (second polarization direction 26) of the light transmitted through the first pupil region E1 is the same as the polarization direction of the first polarization element 122A. The polarization direction (third polarization direction 28) of the light transmitted through the second pupil region E2 is the same as the polarization direction of the second polarization element 122B.

Therefore, in this case, each element of the matrix B is as follows: b11=1.0000; b12=0.0000; b21=0.0000; and b22=1.0000.

$$B = \begin{pmatrix} 1.0000 & 0.0000 \\ 0.0000 & 1.0000 \end{pmatrix}$$

That is, in this case, crosstalk may not occur ideally. As such, in a case in which crosstalk does not occur, it is possible to generate each image from the signals obtained from the first pixel 102A and the second pixel 102B, without performing the crosstalk removal process. That is, the pixel signal X1 of the first pupil region E1 is the pixel signal x1 of the first pixel 102A, and the pixel signal X2 of the second pupil region E2 is the pixel signal x2 of the first pixel 102A.

The image generation unit 200B acquires the coefficient group from the coefficient storage unit 200C, calculates two pixel signals X1 and X2 corresponding to the light in the second polarization direction 26 and the light in the third polarization direction 28 from two pixel signals x1 and x2 obtained from each pixel unit U (x, y) using Expression 1, and generates the image of the light in the second polarization direction 26 and the image of the light in the third polarization direction 28. The image generation unit 200B is an example of an arithmetic unit.

The images corresponding to the light in the second polarization direction 26 and the third polarization direction 28 generated by the image generation unit 200B are output to the outside and are stored in a storage device as needed. In addition, the images are displayed on a display (not illustrated) as needed.

FIG. 16 is a flowchart illustrating the processing flow of an imaging method using the imaging device 1.

First, the first polarization filter 12 aligns the polarization direction of the light transmitted through the first pupil region E1 and the second pupil region E2 with the first polarization direction 24 (Step S10). Then, the wave plate 14 converts the linearly polarized light aligned in the first polarization direction 24 into the circularly polarized light 25 (Step S11). Then, the second polarization filter 16 transmits light in the second polarization direction 26 in the light transmitted through the first pupil region E1 (Step S12). In addition, the second polarization filter 16 transmits light in the third polarization direction 28 in the light transmitted through the second pupil region E2 (Step S13). Then, the first pixel 102A and the second pixel 102B receive the light transmitted through the first pupil region E1 and the light transmitted through the second pupil region E2 (Step S14). Then, the image generation unit 200B performs the crosstalk removal process on the pixel signals obtained from the first pixel 102A and the second pixel 102B (Step S15). Further, in a case in which the second polarization direction 26 and the third polarization direction 28 are orthogonal to each other, the polarization direction of the first polarization element 122A corresponds to the second polarization direction 26, and the polarization direction of the second polarization element 122B corresponds to the third polarization direction 28, crosstalk does not occur ideally, and the crosstalk removal process may not be performed. Then, the image generation unit 200B generates the first image and the second image on the basis of the pixel signal of the first pixel 102A and the pixel signal of the second pixel 102B subjected to the crosstalk removal process (Step S16).

According to this embodiment described above, even in a case in which two different images are generated on the basis of light having two different types of polarization directions, it is possible to generate the images between which the difference in appearance caused by the difference between the polarization directions of the received light is suppressed since the first polarization filter 12 aligns the polarization of the pupil region E once. Further, according to this embodiment, the wave plate 14 converts the linearly polarized light, whose polarization direction has been aligned by the first polarization filter 12, into circularly polarized light or elliptically polarized light. Therefore, the polarization direction of each light component forming a plurality of obtained images can be designed as any direction. The amounts of light of the plurality of obtained images do not depend on the polarization direction of each light component forming the images. Therefore, it is possible to obtain images having a uniform amount of light.

Second Embodiment

Next, a second embodiment of the invention will be described. In this embodiment, a wavelength filter (bandpass filter) 40 is provided, and it is possible to independently obtain images of each wavelength band.

Figure 17:
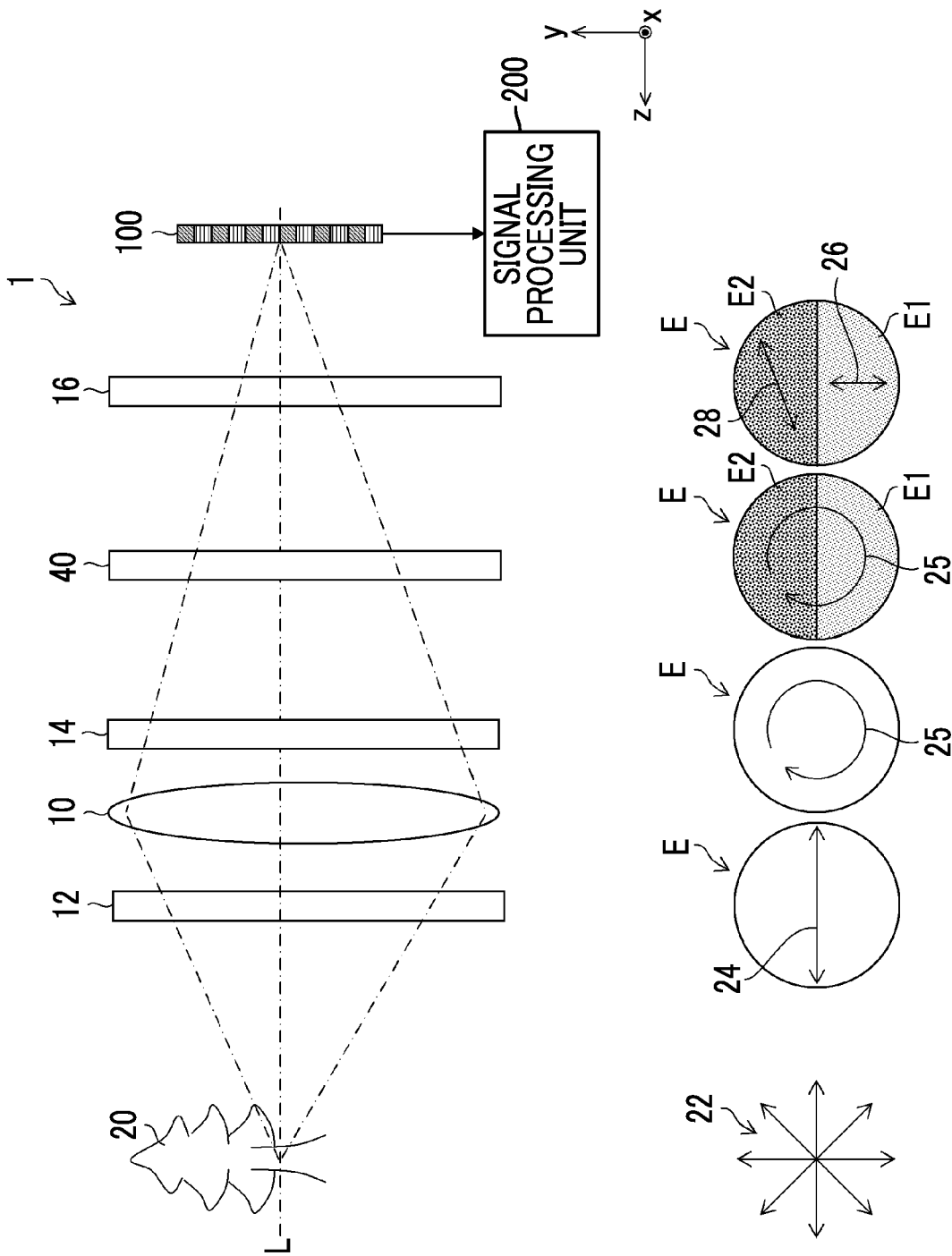
FIG. 17 is a diagram illustrating a schematic configuration of an imaging device.

FIG. 17 is a diagram illustrating a schematic configuration of an imaging device 1 according to this embodiment. In addition, the portions already described in FIG. 1 are denoted by the same reference numerals, and the description thereof will not be repeated.

As illustrated in FIG. 17, the imaging device 1 according to this embodiment comprises an imaging optical system 10, a first polarization filter 12, a wave plate 14, the wavelength filter 40, a second polarization filter 16, an imaging element 100, and a signal processing unit 200. Further, the position where the wavelength filter 40 is provided is not limited to between the wave plate 14 and the second polarization filter 16 and is not particularly limited as long as light transmitted through the first pupil region E1 and light transmitted through the second pupil region E2 can be appropriately incident. Light transmitted through the wavelength filter 40 becomes light in different wavelength bands in the first pupil region E1 and the second pupil region E2 (illustrated below the wavelength filter 40).

Figure 18:
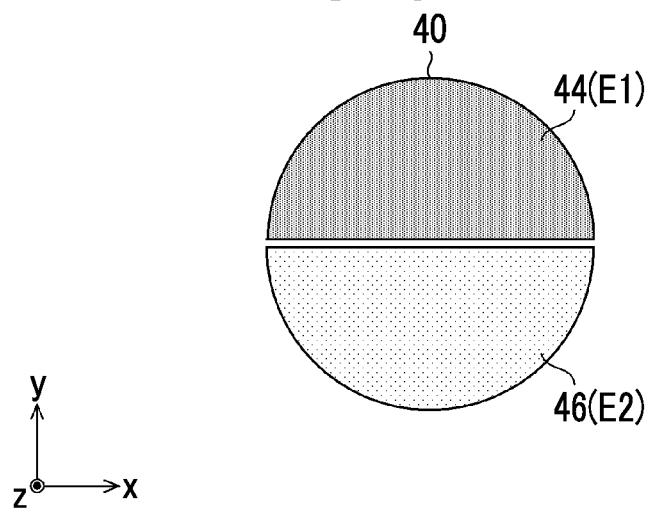
FIG. 18 is a front view illustrating a schematic configuration of a wavelength filter.

FIG. 18 is a front view illustrating a schematic configuration of the wavelength filter 40.

For example, the wavelength filter 40 transmits light in different wavelength bands in the first pupil region E1 and the second pupil region E2. Specifically, a region 44 corresponding to the first pupil region E1 and a region 46 corresponding to the second pupil region E2 transmit light in different wavelength bands. The wavelength filter 40 causes the first image corresponding to the light transmitted through the first pupil region E1 to become an image based on the light in the wavelength band (first wavelength band) transmitted through the region 44 and causes the second image corresponding to the light transmitted through the second pupil region E2 to become an image based on the light in the wavelength band (second wavelength band) transmitted through the region 46. In addition, FIG. 18 illustrates an example of the wavelength filter 40 in a case in which the pupil region E of the imaging optical system 10 is divided into the first pupil region E1 and the second pupil region E2. The wavelength filter 40 integrally comprises a first wavelength filter (first wavelength band) and a second wavelength filter (second wavelength band). In a case in which the pupil region E of the imaging optical system 10 is divided into a first pupil region E1, a second pupil region E2, and a third pupil region E3 (third embodiment) which will be described below, a wavelength filter 40 that transmits three different wavelength bands (a first wavelength band, a second wavelength band, and a third wavelength band) is used. Further, a wavelength filter 40 that integrally comprises a first wavelength filter, a second wavelength filter, and a third wavelength filter may be used. Alternatively, the first wavelength filter, the second wavelength filter, and the third wavelength filter may be provided separately. The images of a plurality of wavelength bands obtained in this way are appropriately applied to, for example, a fruit sugar content test, a food growth test, and a water quality test using spectral reflectance.

According to this embodiment described above, it is possible to independently generate the images of different wavelength bands. In addition, it is possible to generate the images between which the difference in appearance caused by the difference between the polarization directions of the received light is suppressed.

Third Embodiment

Next, a third embodiment of the invention will be described. In this embodiment, three different polarization directions (a second polarization direction 26, a third polarization direction 28, and a fourth polarization direction 30) are used to independently acquire three images.

Figure 19:
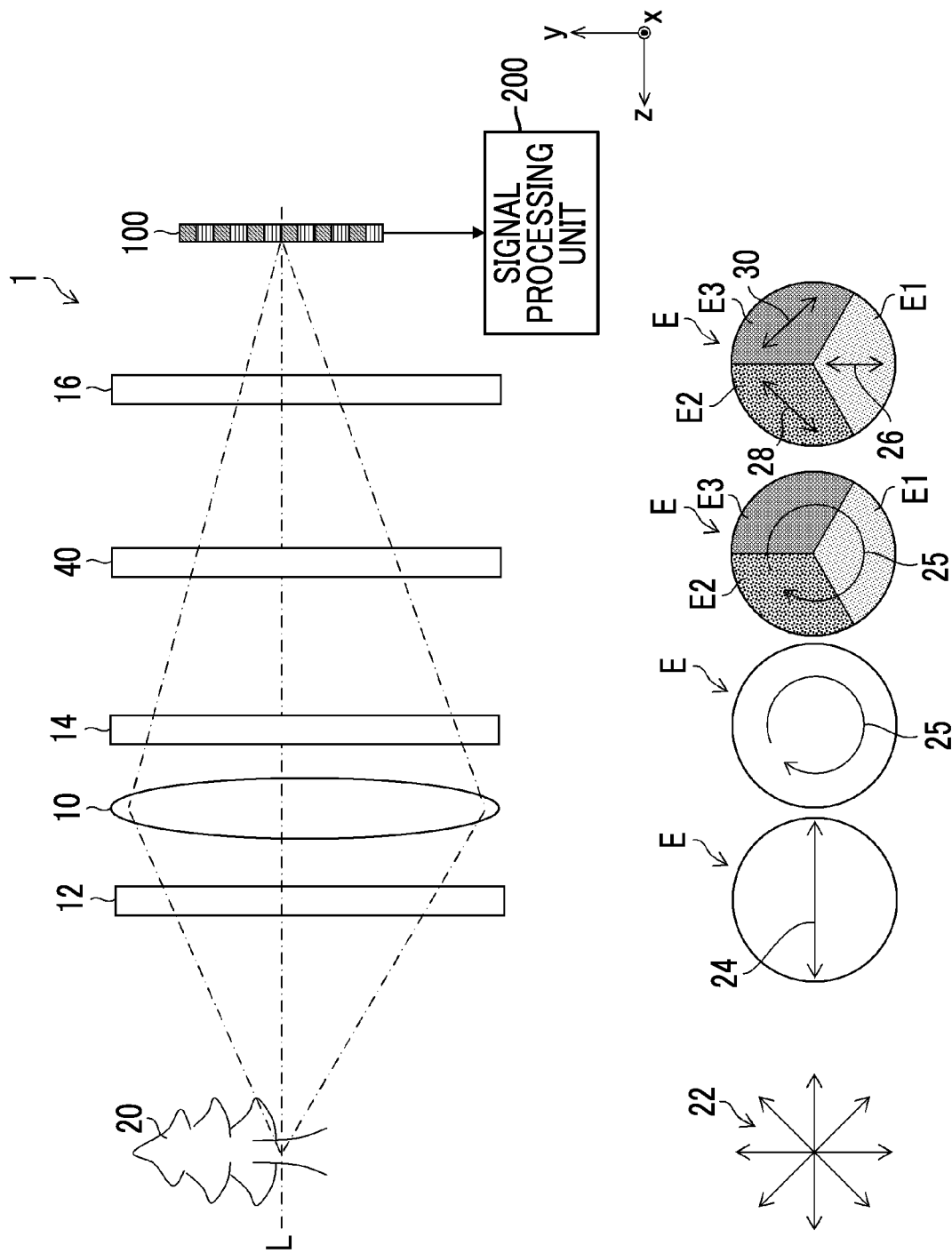
FIG. 19 is a diagram illustrating a schematic configuration of an imaging device.

FIG. 19 is a diagram illustrating a schematic configuration of an imaging device 1 according to the third embodiment. In addition, the portions already described in FIGS. 1 and 17 are denoted by the same reference numerals, and the description thereof will not be repeated.

As illustrated in FIG. 19, the imaging device 1 according to this embodiment comprises an imaging optical system 10, a first polarization filter 12, a wave plate 14, a wavelength filter 40, a second polarization filter 16, an imaging element 100, and a signal processing unit 200. Further, FIG. 19 illustrates a polarization direction 22 of natural light reflected by an object 20, the first polarization direction 24 which is the polarization direction of light transmitted through the first polarization filter 12, circularly polarized light 25 converted by the wave plate 14, and the second polarization direction 26, the third polarization direction 28, and the fourth polarization direction 30 which are the polarization directions of light transmitted through the second polarization filter 16. Further, even in a case in which three images are independently acquired using three different polarization directions, a crosstalk removal process and image generation are similarly performed by applying the above-mentioned method in a case in which two images are acquired.

Figure 20:
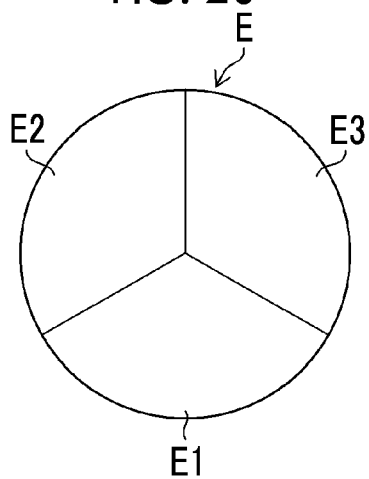
FIG. 20 is a front view illustrating a conceptual pupil region E of an imaging optical system.

FIG. 20 is a front view illustrating a conceptual pupil region E of the imaging optical system 10.

The pupil region E according to this embodiment includes a first pupil region E1, a second pupil region E2, and a third pupil region E3. For example, the first pupil region E1, the second pupil region E2, and the third pupil region E3 are regions obtained by equally dividing the pupil region E at an angle of 120°.

Figure 21A:
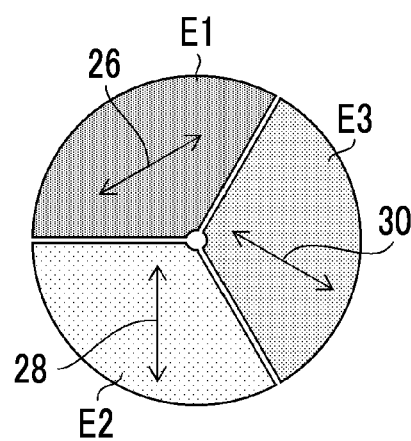
FIGS. 21A and 21B are diagrams illustrating an example of the calculation of the matrix A.
Figure 21B:
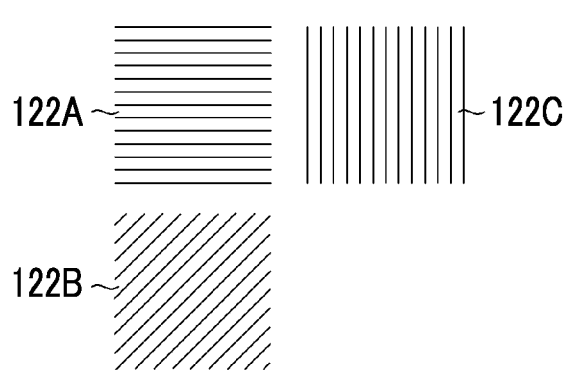
Figure 22A:
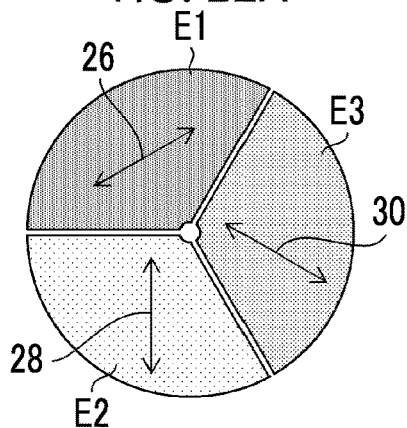
FIGS. 22A and 22B are diagrams illustrating an example of the calculation of the matrix A.
Figure 22B:
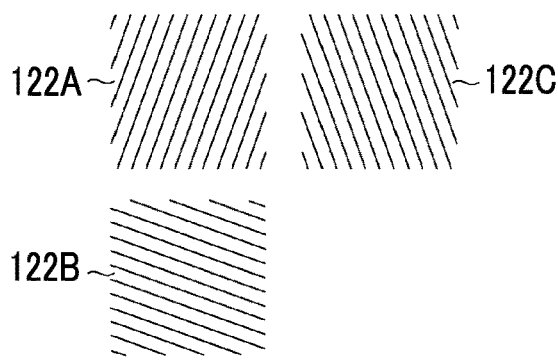

FIGS. 21A to 22B are diagrams illustrating examples of the calculation of the above-mentioned matrix A. In FIGS. 21A to 22B, the second polarization direction 26 of the light transmitted through the first pupil region E1, the third polarization direction 28 of the light transmitted through the second pupil region E2, and the fourth polarization direction 30 of the light transmitted through the third pupil region E3 are illustrated (FIGS. 21A and 22A). Further, in FIGS. 21A to 22B, the polarization directions of a first polarization element 122A, a second polarization element 122B, and a third polarization element 122C are illustrated (FIGS. 21B and 22B). In addition, the imaging element 100 according to this embodiment has a plurality of pixel units which receive the light transmitted through the first pupil region E1, the second pupil region E2, and the third pupil region E3 and each of which is a set of a first pixel, a second pixel, and a third pixel that receive light in different polarization directions.

In the case illustrated in FIGS. 21A and 21B, the light transmitted through the first pupil region E1 is incident on the imaging element 100 as linearly polarized light having a polarization direction of 30°, the light transmitted through the second pupil region E2 is incident on the imaging element 100 as linearly polarized light having a polarization direction of 90°, and the light transmitted through the third pupil region E3 is incident on the imaging element 100 as linearly polarized light having a polarization direction of 150°. Further, the first polarization element 122A transmits light having a polarization direction of 0°, the second polarization element 122B transmits light having a polarization direction of 45°, and the third polarization element 122C transmits light having a polarization direction of 90°.

Therefore, in this case, each element of the matrix B is as follows: b11=0.7500; b12=0.0000; b13=0.7500; b21=0.9330; b22=0.5000; b23=0.0670; b31=0.2500; b32=1.0000; and b33=0.2500.

$$B = \begin{pmatrix} 0.7500 & 0.0000 & 0.7500 \\ 0.9330 & 0.5000 & 0.0670 \\ 0.2500 & 1.0000 & 0.2500 \end{pmatrix}$$

The inverse matrix $B^{-1}$ (matrix A) of the matrix B exists, and each element thereof is as follows: a11=0.0893; a12=1.1547; a13=−0.5774; a21=−0.3333; a22=0.0000; a23=1.0000; a31=1.2440; a32=−1.1547; and a33=0.5774.

$$B^{-1} = \begin{pmatrix} 0.0893 & 1.1547 & -0.5774 \\ -0.3333 & 0.0000 & 1.0000 \\ 1.2440 & -1.1547 & 0.5774 \end{pmatrix} = A$$

In the case illustrated in FIGS. 22A and 22B, the light transmitted through the first pupil region E1 is incident on the imaging element 100 as linearly polarized light having a polarization direction of 30°, the light transmitted through the second pupil region E2 is incident on the imaging element 100 as linearly polarized light having a polarization direction of 90°, and the light transmitted through the third pupil region E3 is incident on the imaging element 100 as linearly polarized light having a polarization direction of 150°. Further, the first polarization element 122A transmits light having a polarization direction of 60°, the second polarization element 122B transmits light having a polarization direction of 150°, and the third polarization element 122C transmits light having a polarization direction of 105°.

Therefore, in this case, each element of the matrix B is as follows: b11=0.7500; b12=0.7500; b13=0.0000; b21=0.2500; b22=0.2500; b23=1.0000; b31=0.0670; b32=0.9330; and b33=0.5000.

$$B = \begin{pmatrix} 0.7500 & 0.7500 & 0.0000 \\ 0.2500 & 0.2500 & 1.0000 \\ 0.0670 & 0.9330 & 0.5000 \end{pmatrix}$$

The inverse matrix $B^{-1}$ (matrix A) of the matrix B exists, and each element thereof is as follows: a11=1.2440; a12=0.5774; a13=−1.1547; a21=0.0893; a22=−0.5774; a23=1.1547; a31=−0.3333; a32=1.0000; and a33=0.0000.

$$B^{-1} = \begin{pmatrix} 1.2440 & 0.5774 & -1.1547 \\ 0.0893 & -0.5774 & 1.1547 \\ -0.3333 & 1.0000 & 0.0000 \end{pmatrix} = A$$

Figure 23:
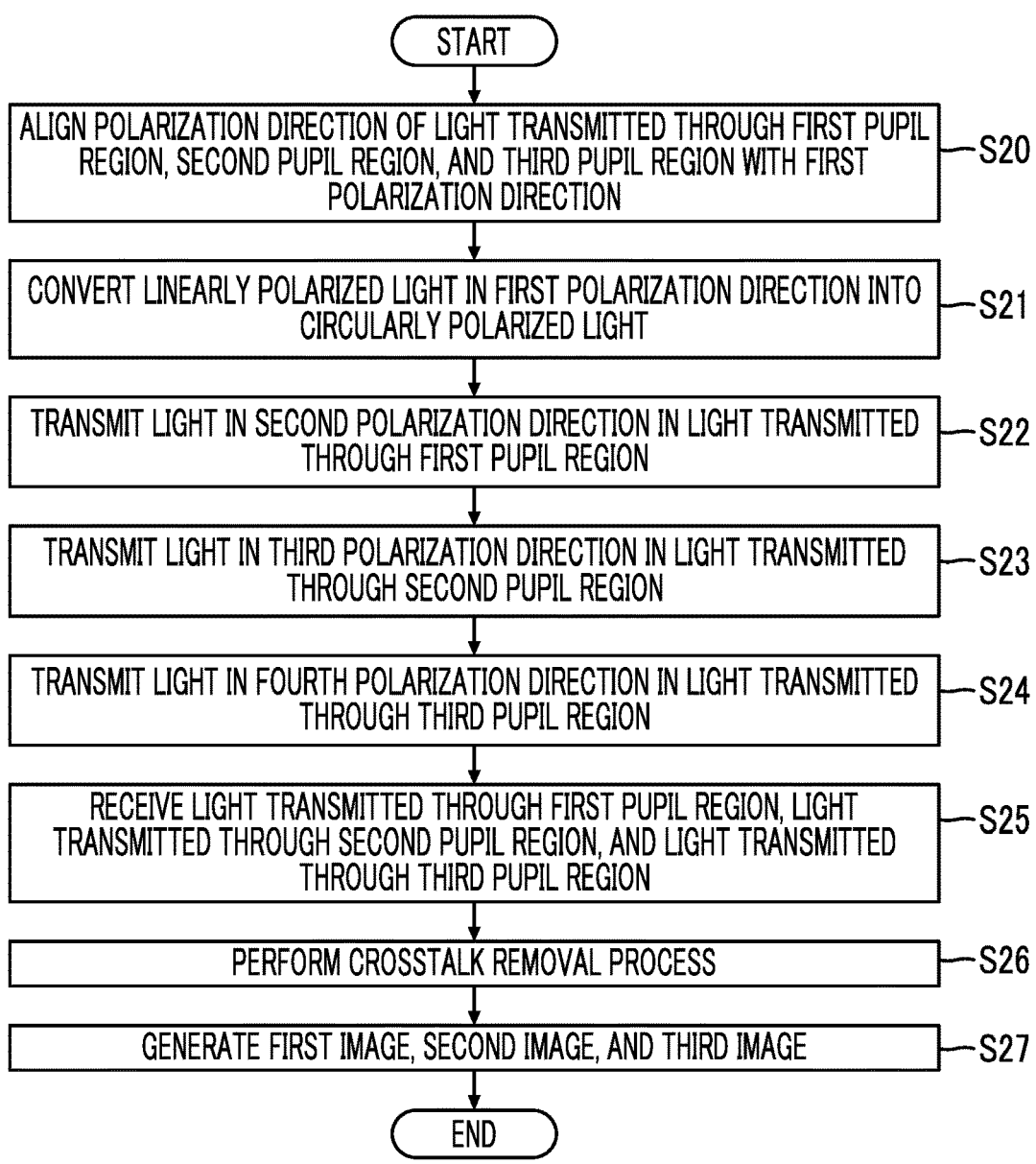
FIG. 23 is a flowchart illustrating a processing flow of an imaging method.

FIG. 23 is a flowchart illustrating the processing flow of an imaging method using the imaging device 1.

First, the first polarization filter 12 aligns the polarization direction of the light transmitted through the first pupil region E1, the second pupil region E2, and the third pupil region E3 with the first polarization direction 24 (Step S20). Then, the wave plate 14 converts the linearly polarized light aligned in the first polarization direction 24 into the circularly polarized light 25 (Step S21). Then, the second polarization filter 16 transmits light in the second polarization direction 26 in the light transmitted through the first pupil region E1 (Step S22). Further, the second polarization filter 16 transmits light in the third polarization direction 28 in the light transmitted through the second pupil region E2 (Step S23). In addition, the second polarization filter 16 transmits light in the fourth polarization direction 30 in the light transmitted through the third pupil region E3 (Step S24). Then, the imaging element 100 receives the light transmitted through the first pupil region E1, the light transmitted through the second pupil region E2, and the light transmitted through the third pupil region E3 (Step S25). Then, the image generation unit 200B performs the crosstalk removal process (Step S26). Then, the image generation unit 200B generates a first image, a second image, and a third image (Step S27).

According to this embodiment described above, even in a case in which three images are independently generated on the basis of light having three different polarization directions, it is possible to generate the images between which the difference in appearance caused by the difference between the polarization directions of the received light is suppressed. In addition, according to this embodiment, the linearly polarized light whose polarization direction has been aligned by the first polarization filter 12 is converted into circularly polarized light or elliptically polarized light. Therefore, the polarization direction of each light component forming a plurality of obtained images can be designed as any direction. Further, the amounts of light of the plurality of obtained images do not depend on the polarization direction of each light component forming the images, and it is possible to obtain images having a uniform amount of light.

Other Examples

FIG. 24 is a diagram illustrating a schematic configuration of an imaging device 1 according to a modification example of the first embodiment described above. In addition, the portions described with reference to FIG. 1 are designated by the same reference numerals, and the description thereof will not be repeated.

In the imaging device 1 according to this example, the wave plate 14 is disposed in front of the imaging optical system 10 (on the side close to the object 20). As such, the positions of the wave plate 14 and the imaging optical system 10 can be interchanged. This configuration in which the wave plate 14 is disposed in front of the imaging optical system 10 makes it possible for the imaging optical system 10 to transmit the light converted into the circularly polarized light 25 by the wave plate 14.

The examples of the invention have been described above. However, the invention is not limited to the above-described embodiments, and various modifications can be made without departing from the spirit of the invention.

EXPLANATION OF REFERENCES

1: imaging device
10: imaging optical system
12: first polarization filter
14: wave plate
16: second polarization filter
20: object
40: wavelength filter
100: imaging element
102A: first pixel
102B: second pixel
110: pixel array layer
112: photodiode
120: polarization element array layer
122A: first polarization element
122B: second polarization element
122C: third polarization element
130: microlens array layer
132: microlens
200: signal processing unit
200A: analog signal processing unit
200B: image generation unit
200C: coefficient storage unit

What is claimed is:

1. An imaging device comprising:
an imaging optical system that has a pupil region including a first pupil region and a second pupil region different from the first pupil region;
a first polarizer that aligns a polarization direction of light transmitted through the first pupil region and the second pupil region with a first polarization direction;
a wave plate that converts linearly polarized light aligned in the first polarization direction by the first polarizer into circularly or elliptically polarized light;
a second polarizer that transmits light in a second polarization direction different from the first polarization direction in the light which has been transmitted through the first pupil region and has been converted into the circularly or elliptically polarized light;
a third polarizer that transmits light in a third polarization direction different from the first polarization direction and the second polarization direction in the light which has been transmitted through the second pupil region and has been converted into the circularly or elliptically polarized light;
an imaging element that receives the light transmitted through the first pupil region and the second pupil region and has a plurality of pixel units each of which is a set of a first pixel and a second pixel receiving light in different polarization directions; and
an image generation unit that performs a crosstalk removal process on pixel signals of the first pixel and the second pixel and generates a first image corresponding to the light transmitted through the first pupil region and a second image corresponding to the light transmitted through the second pupil region on the basis of the pixel signals subjected to the crosstalk removal process.

2. The imaging device according to claim 1, further comprising:
a first wavelength filter that transmits light in a first wavelength band in the light transmitted through the first pupil region; and
a second wavelength filter that transmits light in a second wavelength band in the light transmitted through the second pupil region.

3. The imaging device according to claim 1,
wherein the wave plate is a 1/4 wave plate.

4. The imaging device according to claim 1,
wherein the first polarizer shields s-polarized light.

5. The imaging device according to claim 1
wherein the second polarizer transmits the light in the second polarization direction orthogonal to the first polarization direction in the light which has been transmitted through the first pupil region and has been converted into the circularly or elliptically polarized light.

6. The imaging device according to claim 1,
wherein, in the imaging element, the pixel unit includes a pixel including a polarization element.

7. The imaging device according to claim 6,
wherein, in the imaging element, the polarization element is provided between a photodiode and a microlens which constitute the pixel.

8. An imaging device comprising:
an imaging optical system that has a pupil region including a first pupil region and a second pupil region different from the first pupil region;
a first polarizer that aligns a polarization direction of light transmitted through the first pupil region and the second pupil region with a first polarization direction;
a wave plate that converts linearly polarized light aligned in the first polarization direction by the first polarizer into circularly or elliptically polarized light;
a second polarizer that transmits light in a second polarization direction different from the first polarization direction in the light which has been transmitted through the first pupil region and has been converted into the circularly or elliptically polarized light;
a third polarizer that transmits light in a third polarization direction, which is different from the first polarization direction and is orthogonal to the second polarization direction, in the light which has been transmitted through the first pupil region and has been converted into the circularly or elliptically polarized light;
an imaging element that receives the light transmitted through the first pupil region and the second pupil region and has a plurality of pixel units each of which is a set of a first pixel receiving the light in the second polarization direction and a second pixel receiving the light in the third polarization direction; and
an image generation unit that generates a first image corresponding to the light transmitted through the first pupil region and a second image corresponding to the light transmitted through the second pupil region on the basis of pixel signals of the first pixel and the second pixel.

9. The imaging device according to claim 8, further comprising:
a first wavelength filter that transmits light in a first wavelength band in the light transmitted through the first pupil region; and
a second wavelength filter that transmits light in a second wavelength band in the light transmitted through the second pupil region.

10. The imaging device according to claim 8, wherein the wave plate is a 1/4 wave plate.

11. The imaging device according to claim 8, wherein the first polarizer shields s-polarized light.

12. The imaging device according to claim 8, wherein the second polarizer transmits the light in the second polarization direction orthogonal to the first polarization direction in the light which has been transmitted through the first pupil region and has been converted into the circularly or elliptically polarized light.

13. An imaging device comprising:
an imaging optical system that has a pupil region including a first pupil region, a second pupil region different from the first pupil region, and a third pupil region different from the first pupil region and the second pupil region;
a first polarizer that aligns a polarization direction of light transmitted through the first pupil region, the second pupil region, and the third pupil region with a first polarization direction;
a wave plate that converts linearly polarized light aligned in the first polarization direction by the first polarizer into circularly or elliptically polarized light;
a second polarizer that transmits light in a second polarization direction different from the first polarization direction in the light which has been transmitted through the first pupil region and has been converted into the circularly or elliptically polarized light;
a third polarizer that transmits light in a third polarization direction different from the first polarization direction and the second polarization direction in the light which has been transmitted through the second pupil region and has been converted into the circularly or elliptically polarized light;
a fourth polarizer that transmits light in a fourth polarization direction different from the first polarization direction, the second polarization direction, and the third polarization direction in the light which has been transmitted through the third pupil region and has been converted into the circularly or elliptically polarized light;
an imaging element that receives the light transmitted through the first pupil region, the second pupil region, and the third pupil region and has a plurality of pixel units each of which is a set of a first pixel, a second pixel, and a third pixel receiving light in different polarization directions; and
an image generation unit that performs a crosstalk removal process on pixel signals of the first pixel, the second pixel, and the third pixel and generates a first image corresponding to the light transmitted through the first pupil region, a second image corresponding to the light transmitted through the second pupil region, and a third image corresponding to the light transmitted through the third pupil region on the basis of the pixel signals subjected to the crosstalk removal process.

14. The imaging device according to claim 13, further comprising:
a first wavelength filter that transmits light in a first wavelength band in the light transmitted through the first pupil region;
a second wavelength filter that transmits light in a second wavelength band in the light transmitted through the second pupil region; and
a third wavelength filter that transmits light in a third wavelength band in the light transmitted through the third pupil region.

15. The imaging device according to claim 13, wherein the wave plate is a 1/4 wave plate.

16. The imaging device according to claim 13, wherein the first polarizer shields s-polarized light.

17. The imaging device according to claim 13, wherein the second polarizer transmits the light in the second polarization direction orthogonal to the first polarization direction in the light which has been transmitted through the first pupil region and has been converted into the circularly or elliptically polarized light.

18. An imaging method comprising:
a step of causing a first polarizer to align a polarization direction of light transmitted through a first pupil region and a second pupil region of an imaging optical system, which has a pupil region including the first pupil region and the second pupil region different from the first pupil region, with a first polarization direction;
a step of causing a wave plate to convert linearly polarized light aligned in the first polarization direction by the first polarizer into circularly or elliptically polarized light;
a step of causing a second polarizer to transmit light in a second polarization direction different from the first polarization direction in the light which has been transmitted through the first pupil region and has been converted into the circularly or elliptically polarized light;
a step of causing a third polarizer to transmit light in a third polarization direction different from the first polarization direction and the second polarization direction in the light which has been transmitted through the second pupil region and has been converted into the circularly or elliptically polarized light; and
a step of performing a crosstalk removal process on pixel signals of a first pixel and a second pixel of an imaging element, which receives the light transmitted through the first pupil region and the second pupil region and has a plurality of pixel units each of which is a set of the first pixel and the second pixel receiving light in different polarization directions, and generating a first image corresponding to the light transmitted through the first pupil region and a second image corresponding to the light transmitted through the second pupil region on the basis of the pixel signals subjected to the crosstalk removal process.

19. An imaging method comprising:
a step of causing a first polarizer to align a polarization direction of light transmitted through a first pupil region and a second pupil region of an imaging optical system, which has a pupil region including the first pupil region and the second pupil region different from the first pupil region, with a first polarization direction;
a step of causing a wave plate to convert linearly polarized light aligned in the first polarization direction by the first polarizer into circularly or elliptically polarized light;
a step of causing a second polarizer to transmit light in a second polarization direction different from the first polarization direction in the light which has been transmitted through the first pupil region and has been converted into the circularly or elliptically polarized light;

a step of causing a third polarizer to transmit light in a third polarization direction, which is different from the first polarization direction and is orthogonal to the second polarization direction, in the light which has been transmitted through the first pupil region and has been converted into the circularly or elliptically polarized light; and a step of generating a first image corresponding to the light transmitted through the first pupil region and a second image corresponding to the light transmitted through the second pupil region on the basis of pixel signals of a first pixel and a second pixel of an imaging element which receives the light transmitted through the first pupil region and the second pupil region and has a plurality of pixel units each of which is a set of the first pixel receiving the light in the second polarization direction and the second pixel receiving the light in the third polarization direction.

20. An imaging method comprising:

a step of causing a first polarizer to align a polarization direction of light transmitted through a first pupil region, a second pupil region, and a third pupil region of an imaging optical system, which has a pupil region including the first pupil region, the second pupil region different from the first pupil region, and the third pupil region different from the first pupil region and the second pupil region, with a first polarization direction;

a step of causing a wave plate to convert linearly polarized light aligned in the first polarization direction by the first polarizer into circularly or elliptically polarized light;

a step of causing a second polarizer to transmit light in a second polarization direction different from the first polarization direction in the light which has been transmitted through the first pupil region and has been converted into the circularly or elliptically polarized light;

a step of causing a third polarizer to transmit light in a third polarization direction different from the first polarization direction and the second polarization direction in the light which has been transmitted through the second pupil region and has been converted into the circularly or elliptically polarized light;

a step of causing a fourth polarizer to transmit light in a fourth polarization direction different from the first polarization direction, the second polarization direction, and the third polarization direction in the light which has been transmitted through the third pupil region and has been converted into the circularly or elliptically polarized light; and a step of performing a crosstalk removal process on pixel signals of a first pixel, a second pixel, and a third pixel of an imaging element, which receives the light transmitted through the first pupil region, the second pupil region, and the third pupil region and has a plurality of pixel units each of which is a set of the first pixel, the second pixel, and the third pixel receiving light in different polarization directions, and generating a first image corresponding to the light transmitted through the first pupil region, a second image corresponding to the light transmitted through the second pupil region, and a third image corresponding to the light transmitted through the third pupil region on the basis of the pixel signals subjected to the crosstalk removal process.

* * * * *